(12) United States Patent
Nishibayashi et al.

(10) Patent No.: US 8,795,463 B2
(45) Date of Patent: Aug. 5, 2014

(54) JOINT SYSTEM, JOINT METHOD, PROGRAM AND COMPUTER STORAGE MEDIUM

(75) Inventors: Takahiro Nishibayashi, Minato-ku (JP); Yasuharu Iwashita, Koshi (JP); Takeshi Tamura, Koshi (JP); Tatsuya Kitayama, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 156 days.

(21) Appl. No.: 13/581,353

(22) PCT Filed: Mar. 1, 2011

(86) PCT No.: PCT/JP2011/054606
§ 371 (c)(1),
(2), (4) Date: Aug. 27, 2012

(87) PCT Pub. No.: WO2011/111565
PCT Pub. Date: Sep. 15, 2011

(65) Prior Publication Data
US 2012/0318432 A1    Dec. 20, 2012

(30) Foreign Application Priority Data

Mar. 9, 2010   (JP) .............................. 2010-051911

(51) Int. Cl.
B29C 65/00    (2006.01)
H01L 21/18    (2006.01)
H01L 21/67    (2006.01)

(52) U.S. Cl.
CPC ........ *H01L 21/187* (2013.01); *H01L 21/67092* (2013.01); *H01L 21/67184* (2013.01)
USPC ............ 156/285; 156/60; 156/82; 156/272.2; 156/272.6; 156/281; 156/345.35; 156/379.6; 156/381; 156/382; 156/389; 156/535

(58) Field of Classification Search
CPC ...................... H01L 21/187; H01L 21/67092; H01L 21/67184
USPC .......... 156/60, 82, 272.2, 272.6, 281, 345.35, 156/379.6, 389, 535, 285, 381, 382
See application file for complete search history.

(56) References Cited

U.S. PATENT DOCUMENTS

2004/0171231 A1* 9/2004 Yanagita et al. ............... 438/455
2006/0032582 A1* 2/2006 Chen et al. ................. 156/272.6

FOREIGN PATENT DOCUMENTS

JP    A-02-135722    5/1990
JP    H03-91227 A    4/1991
(Continued)

OTHER PUBLICATIONS

International Search Report mailed on May 31, 2011 in corresponding International Application No. PCT/JP2011/054606 (with English copy enclosed).

*Primary Examiner* — Katarzyna Wyrozebski Lee
*Assistant Examiner* — Joshel Rivera
(74) *Attorney, Agent, or Firm* — Posz Law Group, PLC

(57) ABSTRACT

A joint system includes: a transfer-in/out station capable of holding a plurality of substrates or a plurality of superposed substrates, and transferring-in/out the substrates or superposed substrates to/from a processing station; and the processing station performing predetermined processing on the substrates and joining the substrates together. The processing station includes: a surface activation apparatus activating a front surface of the substrate; a surface hydrophilizing apparatus hydrophilizing and cleaning the front surface of the substrate; a joint apparatus joining the substrates together; and a transfer region for transferring the substrate or superposed substrate to the surface activation apparatus, the surface hydrophilizing apparatus, and the joint apparatus.

11 Claims, 20 Drawing Sheets

(56) References Cited

FOREIGN PATENT DOCUMENTS

| JP | H07-249749 A | 9/1995 |
| JP | A-2004-266071 | 9/2004 |
| JP | A-2004-337928 | 12/2004 |
| JP | A-2006-258958 | 9/2006 |
| JP | 2007-036130 A | 2/2007 |
| JP | A-2007-36130 | 2/2007 |
| JP | A-2009-164197 | 7/2009 |
| JP | A-2009-212402 | 9/2009 |

* cited by examiner

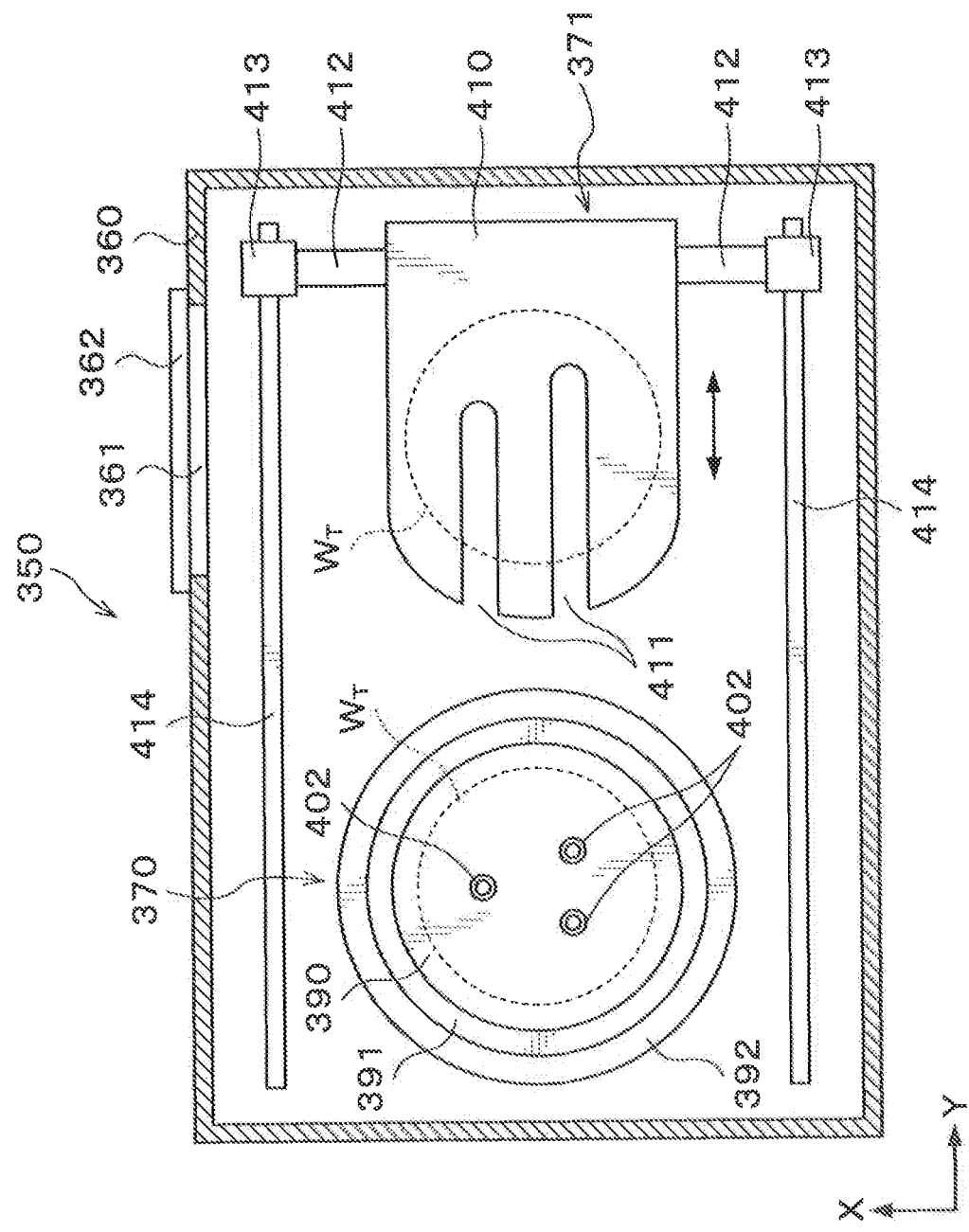

JOINT SYSTEM, JOINT METHOD, PROGRAM AND COMPUTER STORAGE MEDIUM

CROSS REFERENCE TO RELATED APPLICATION

The present application is a U.S. national stage of PCT/JP2011/054606 filed on Mar. 1, 2011, and is based on Japanese Patent Application No. 2010-051911 filed on Mar. 9, 2010, the disclosure of which is incorporated herein by reference.

TECHNICAL FIELD

The present invention relates to a joint system, a joint method, a program, and a computer storage medium for joining substrates together.

BACKGROUND ART

Recently, semiconductor devices become more highly integrated. When a plurality of highly integrated semiconductor devices are arranged within a horizontal plane and connected with one another by wiring into a product, the wiring length may increase to lead to an increase in resistance of the wiring and increase in a wiring delay.

Hence, it is proposed to use the three-dimensional integration technology of stacking the semiconductor devices in three dimensions. In this three-dimensional integration technology, for example, a joint apparatus is used to join two semiconductor wafers (hereinafter, referred to as "wafers"). The joint apparatus includes, for example, a beam irradiation means irradiating the front surface of the wafer with inert gas ion beams or inert gas neutral atom beams, and a set of work rollers pressing two wafers in the state that the two wafers are superposed. Then, in the joint apparatus, the beam irradiation means activates the front surfaces (joint surfaces) of the wafers to generate the Van der Waals force between the front surfaces of the two wafers in the state that the two wafers are superposed to thereby temporarily join them. Thereafter, by pressing the two wafers, the wafers are joined together (Patent Document 1).

[Patent Document 1] Japanese Patent Application Laid-open No. 2004-337928

DISCLOSURE OF THE INVENTION

Problems to Be Solved by the Invention

However, in the case of using the joint apparatus described in Patent Document 1, the wafers may break due to the load when pressing the two wafers by the set of work rollers.

Further, since the temporary joint performed by generating the Van der Waals force between the activated front surfaces of the two wafers is insufficient in joining strength, positional displacement of the wafers may occur when the two wafers are pressed while being deviated from the vertical direction.

In addition, for appropriately joining the wafers together, it takes a lot of time to press the two wafers to lead to a reduction in throughput of the wafer joint processing.

The present invention has been made in consideration of the above points and its object is to improve the throughput of substrate joint processing while appropriately joining substrates together.

Means for Solving the Problems

In order to achieve the above object, the present invention is a joint system joining substrates together, including: a processing station performing predetermined processing on substrates and joining the substrates together; and a transfer-in/out station capable of holding a plurality of substrates or a plurality of superposed substrates in which the substrates are joined together, and transferring-in/out the substrates or superposed substrates to/from the processing station, wherein the processing station includes: a surface activation apparatus activating a front surface to be joined of the substrate; a surface hydrophilizing apparatus hydrophilizing the front surface of the substrate activated in the surface activation apparatus; a joint apparatus joining the substrates having the surfaces hydrophilized in the surface hydrophilizing apparatus together; and a transfer region for transferring the substrate or superposed substrate to the surface activation apparatus, the surface hydrophilizing apparatus, and the joint apparatus. Note that the front surface of the substrate means a joint surface at which the substrate is to be joined.

According to the joint system of the present invention, it is possible to activate the front surface of the substrate in the surface activation apparatus, and then hydrophilize the front surface of the substrate in the surface hydrophilizing apparatus to form hydroxyls on the front surface. Then, after the activated front surfaces of the substrates are joined together by the Van der Waals force in the joint apparatus, the hydroxyls on the hydrophilized front surfaces of the substrates are hydrogen-bonded, whereby the substrates can be strongly joined together. This eliminates the necessity to press the substrates in the superposed state as in the prior art. Accordingly, there is no possibility of breakage of the substrates or no possibility of positional displacement of substrates as in the prior art. Furthermore, since the substrates are joined together only by the Van der Waals force and hydrogen bonding, the time required for joint can be reduced. Consequently, according to the present invention, it is possible to improve the throughput of substrate joint processing while appropriately joining the substrates together. Further, the transfer-in/out station is capable of holding a plurality substrates or a plurality of superposed substrates, thereby making it possible to successively transfer the substrates from the transfer-in/out station to the processing station and successively process the substrates in the processing station so as to further improve the throughput of the substrate joint processing.

The present invention according to another aspect is a method of joining substrates together, including: a surface activation step of activating a front surface to be joined of a substrate in a surface activation apparatus; a surface hydrophilizing step of then transferring the substrate to a surface hydrophilizing apparatus via a transfer region, and hydrophilizing the front surface of the substrate in the surface hydrophilizing apparatus; and a joint step of then transferring the substrate to a joint apparatus via the transfer region, and joining the substrates subjected to the surface activation step and the surface hydrophilizing step together by a Van der Waals force and hydrogen bonding in the joint apparatus, wherein the surface activation step, the surface hydrophilizing step, and the joint step are successively performed on a plurality of substrates.

The present invention according to still another aspect is a program running on a computer of a control unit controlling a joint system to cause the joint system to execute a joint method of joining substrates together, the joint method including: a surface activation step of activating a front surface to be joined of a substrate in a surface activation apparatus; a surface hydrophilizing step of then transferring the substrate to a surface hydrophilizing apparatus via a transfer region, and hydrophilizing the front surface of the substrate in the surface hydrophilizing apparatus; and a joint step of then transferring the substrate to a joint apparatus via the transfer region, and joining the substrates subjected to the surface activation step and the surface hydrophilizing step together by a Van der Waals force and hydrogen bonding in the joint apparatus, wherein the surface activation step, the surface hydrophilizing step, and the joint step are successively performed on a plurality of substrates.

The present invention according to yet another aspect is a readable computer storage medium storing a program running on a computer of a control unit controlling a joint system to cause the joint system to execute a joint method of joining substrates together, the joint method including: a surface activation step of activating a front surface to be joined of a substrate in a surface activation apparatus; a surface hydrophilizing step of then transferring the substrate to a surface hydrophilizing apparatus via a transfer region, and hydrophilizing the front surface of the substrate in the surface hydrophilizing apparatus; and a joint step of then transferring the substrate to a joint apparatus via the transfer region, and joining the substrates subjected to the surface activation step and the surface hydrophilizing step together by a Van der Waals force and hydrogen bonding in the joint apparatus, wherein the surface activation step, the surface hydrophilizing step, and the joint step are successively performed on a plurality of substrates.

Effect of the Invention

According to the present invention, it is possible to improve the throughput of substrate joint processing while appropriately joining substrates together.

BRIEF DESCRIPTION OF THE DRAWINGS

FIG. 28 A transverse sectional view illustrating the outline of the configuration of the thermal processing apparatus.

BEST MODE FOR CARRYING OUT THE INVENTION

Figure 1:
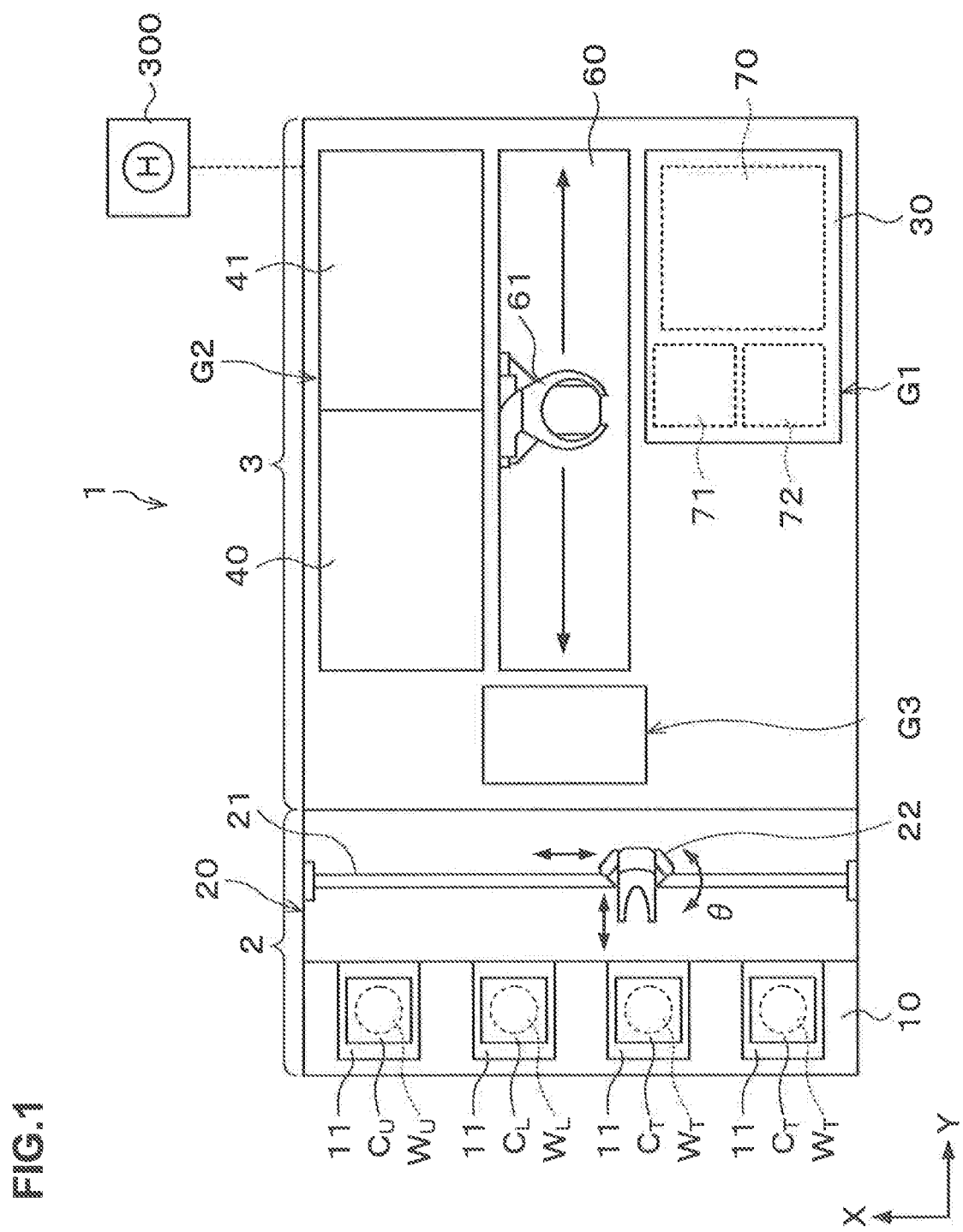
FIG. 1 A plan view illustrating the outline of the configuration of a joint system according to this embodiment.
Figure 2:
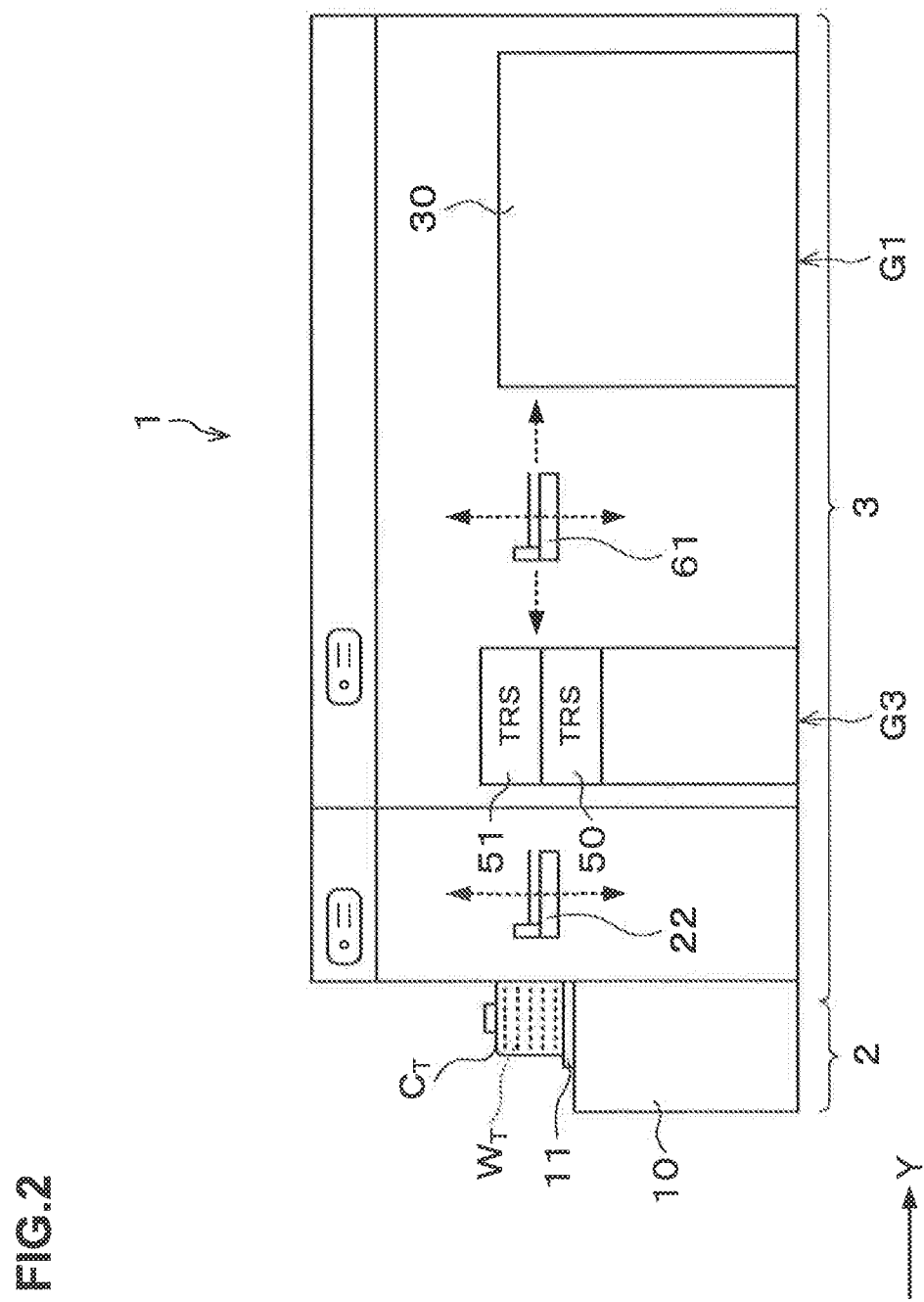
FIG. 2 A side view illustrating the outline of the internal configuration of the joint system according to this embodiment.

Hereinafter, an embodiment of the present invention will be described. FIG. 1 is a plan view illustrating the outline of the configuration of a joint system 1 according to this embodiment. FIG. 2 is a side view illustrating the outline of the internal configuration of the joint system 1.

Figure 3:
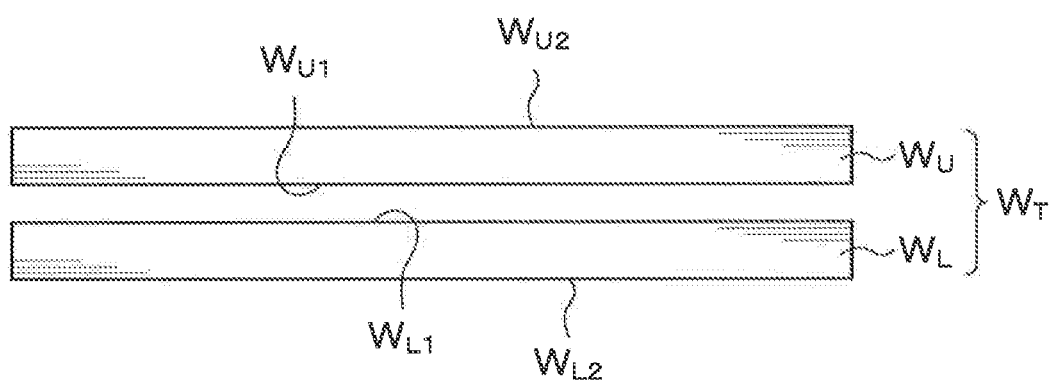
FIG. 3 A side view of an upper wafer and a lower wafer.

In the joint system 1, for example, wafers $W_U$, $W_L$ as two substrates are joined together as illustrated in FIG. 3. Hereinafter, the wafer located on the upper side is referred to as an "upper wafer $W_U$," and the wafer located on the lower side is referred to as a "lower wafer $W_L$." Further, the joint surface at which the upper wafer $W_U$ is to be joined is referred to as a "front surface $W_{U1}$" and the surface opposite to the front surface $W_{U1}$ is referred to as a "rear surface $W_{U2}$." Similarly, the joint surface at which the lower wafer $W_L$ is to be joined is referred to as a "front surface $W_{L1}$" and the surface opposite to the front surface $W_{L1}$ is referred to as a "rear surface $W_{L2}$." In the joint system 1, the upper wafer $W_U$ and the lower wafer $W_L$ are joined together to form a superposed wafer $W_T$ as a superposed substrate.

The joint system 1 has the configuration in which a transfer-in/out station 2 to/from which cassettes $C_U$, $C_L$, $C_T$ capable of housing a plurality of wafers $W_U$, $W_L$ and a plurality of superposed wafers $W_T$ respectively are transferred from/to the outside, and a processing station 3 including various kinds of processing apparatuses performing predetermined processing on the wafers $W_U$, $W_L$, and superposed wafers $W_T$r, are integrally connected as illustrated in FIG. 1.

In the transfer-in/out station 2, a cassette mounting table 10 is provided. On the cassette mounting table 10, a plurality of, for example, four cassette mounting plates 11 are provided. The cassette mounting plates 11 are arranged side by side in a line in an X-direction being the horizontal direction (a top-down direction in FIG. 1). On the cassette mounting plates 11, the cassettes $C_U$, $C_L$, $C_T$ can be mounted when the cassettes $C_U$, $C_L$, $C_T$ are transferred into/out of the outside of the joint system 1. As described above, the transfer-in/out station 2 is configured to be capable of holding a plurality of upper wafers $W_U$, a plurality of lower wafers $W_L$, and a plurality of superposed wafers $W_T$. Note that the number of cassette mounting plates 11 is not limited to this embodiment, but can be arbitrarily determined. Further, one of the cassettes may be used for collecting defective wafers. In other words, the cassette is a cassette that is capable of separating wafers having defects in jointing the upper wafer $W_U$ and the lower wafer $W_L$ occurred due to various causes, from other normal superposed wafers $W_T$. In this embodiment, one cassette $C_T$ among the plurality of cassettes $C_T$ is used for collecting the defective wafers, and the other cassettes $C_T$ are used for housing normal superposed wafers $W_T$.

In the transfer-in/out station 2, a wafer transfer part 20 is provided adjacent to the cassette mounting table 10. In the wafer transfer part 20, a wafer transfer apparatus 22 movable on a transfer path 21 extending in the X-direction is provided. The wafer transfer apparatus 22 is movable also in the vertical direction and around the vertical axis (in a θ-direction) and thus can transfer the wafers $W_U$, $W_L$ and the superposed wafers $W_T$ between the cassettes $C_U$, $C_L$, $C_T$ on the cassette mounting plates 11 and later-described transition apparatuses 50, 51 in a third processing block G3 in the processing station 3. An air current directed vertically downward called downflow is generated inside the wafer transfer part 20. Then, the atmosphere inside the wafer transfer part 20 is exhausted from an exhaust port (not illustrated).

In the processing station 3, a plurality of, for example, three processing blocks G1, G2, G3 each including various kinds of apparatuses are provided. For example, the first processing block G1 is provided, for example, on the front side in the processing station 3 (on an X-direction negative direction side in FIG. 1), and the second processing block G2 is provided on the back side in the processing station 3 (on an X-direction positive direction side in FIG. 1). Further, the third processing block G3 is provided on the transfer-in/out station 2 side in the processing station 3 (on a Y-direction negative direction side in FIG. 1).

For example, in the first processing block G1, a surface activation apparatus 30 activating the front surface $W_{U1}$, $W_{L1}$ of the wafer $W_U$, $W_L$ is disposed.

For example, in the second processing block G2, a surface hydrophilizing apparatus 40 hydrophilizing the front surfaces $W_{U1}$, $W_{L1}$ of the wafers $W_U$, $W_L$ and cleaning the front surfaces $W_{U1}$, $W_{L1}$ with pure water and a joint apparatus 41 joining the wafers $W_U$, $W_L$ together are arranged side by side in a Y-direction that is a horizontal direction in this order from the transfer-in/out station 2 side.

For example, in the third processing block G3, the transition apparatuses 50, 51 are provided at two tiers in order from the bottom as illustrated in FIG. 2.

In an area surrounded by the first processing block G1 to the third processing block G3, a wafer transfer region 60 is formed as illustrated in FIG. 1. In the wafer transfer region 60, for example, a wafer transfer apparatus 61 is disposed. Note that an air current directed vertically downward called downflow is generated inside the wafer transfer region 60. Then, the atmosphere inside the wafer transfer region 60 is exhausted from an exhaust port (not illustrated). Accordingly, the pressure inside the wafer transfer region 60 is equal to or more than an atmospheric pressure, and transfer of the wafers $W_U$, $W_L$ and the superposed wafer $W_T$ in a so-called atmospheric system is performed in the wafer transfer region 60.

The wafer transfer apparatus 61 has a transfer arm movable, for example, in the vertical direction, the horizontal direction (a Y-direction, an X-direction), and around a vertical axis. The wafer transfer apparatus 61 can move in the wafer transfer region 60 to transfer the wafers $W_U$, $W_L$ and the superposed wafer $W_T$ to a predetermined apparatus in the first processing block 61, the second processing block G2 and the third processing block G3 therearound.

Figure 4:
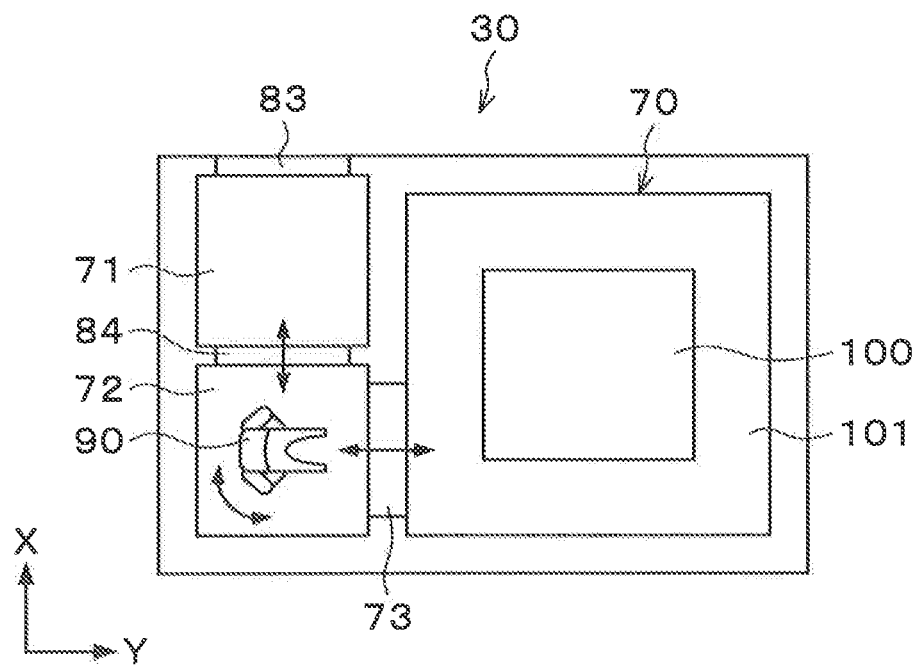
FIG. 4 A plan view illustrating the outline of the configuration of a surface activation apparatus.

Next, the configuration of the aforementioned surface activation apparatus 30 will be described. The surface activation apparatus 30 has a processing part 70 performing processing for activating the front surface $W_{U1}$, $W_{L1}$ of the wafer $W_U$, $W_L$, a transfer-in/out part 71 for transferring-in/out the wafer $W_U$, $W_L$ to/from the wafer transfer region 60, and a transfer part 72 transferring the wafer $W_U$, $W_L$ between the processing part 70 and the transfer-in/out part 71 as illustrated in FIG. 4. The processing part 70 and the transfer part 72 are connected to each other via a gate valve 73 side by side in the Y-direction being the horizontal direction. Further, the transfer-in/out part 71 and the transfer part 72 are arranged side by side in the X-direction being the horizontal direction.

Figure 5:
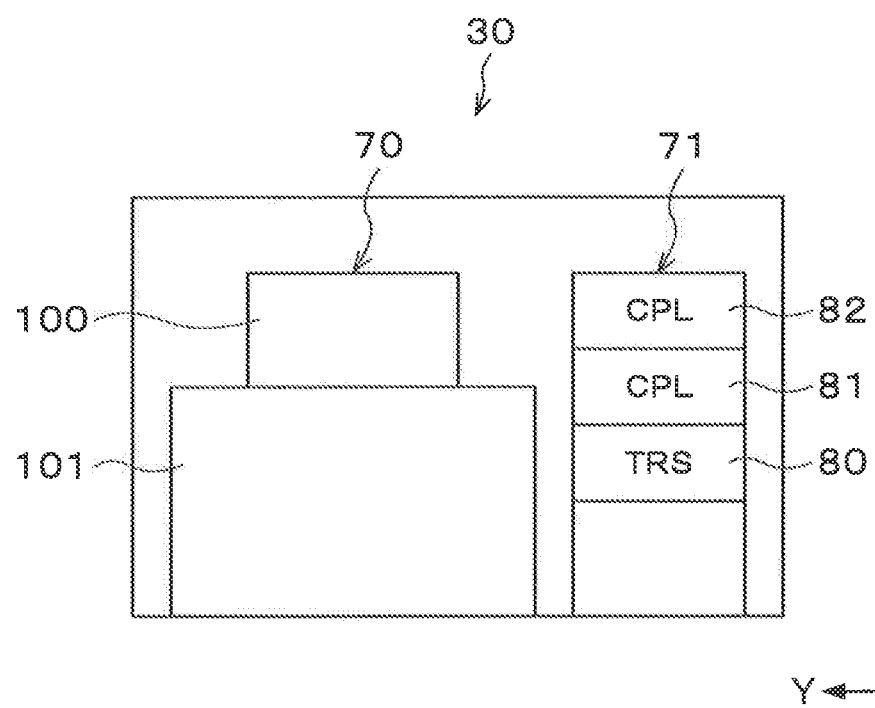
FIG. 5 A side view illustrating the outline of the internal configuration of the surface activation apparatus.

In the transfer-in/out part 71, a transition unit 80 temporarily mounting the wafer $W_U$, $W_L$ thereon and temperature-adjustment units 81, 82 adjusting the temperature of the wafer $W_U$, $W_L$, are provided at three tiers from the bottom as illustrated in FIG. 5. At side surfaces on the wafer transfer region 60 side of the transition unit 80 and the temperature-adjustment units 81, 82, opening/closing shutters 83 are provided respectively via transfer-in/out ports (not illustrated) for the wafers $W_U$, $W_L$ as illustrated in FIG. 4. Further, also at side surfaces on the transfer part 72 side of the transition unit 80 and the temperature-adjustment units 81, 82, opening/closing shutters 84 are provided respectively via transfer-in/out ports (not illustrated) for the wafers $W_U$, $W_L$.

In the transfer part 72, a wafer transfer body 90 is provided which is movable in the vertical direction, the horizontal direction and around the vertical axis as illustrated in FIG. 4. The wafer transfer body 90 can transfer the wafer $W_U$, $W_L$ between the processing part 70 and the transfer-in/out part 71. Further, in the transfer part 72, a suction port (not illustrated) is formed which communicates with a vacuum pump (not illustrated) vacuuming the atmosphere inside the transfer part 72.

Figure 6:
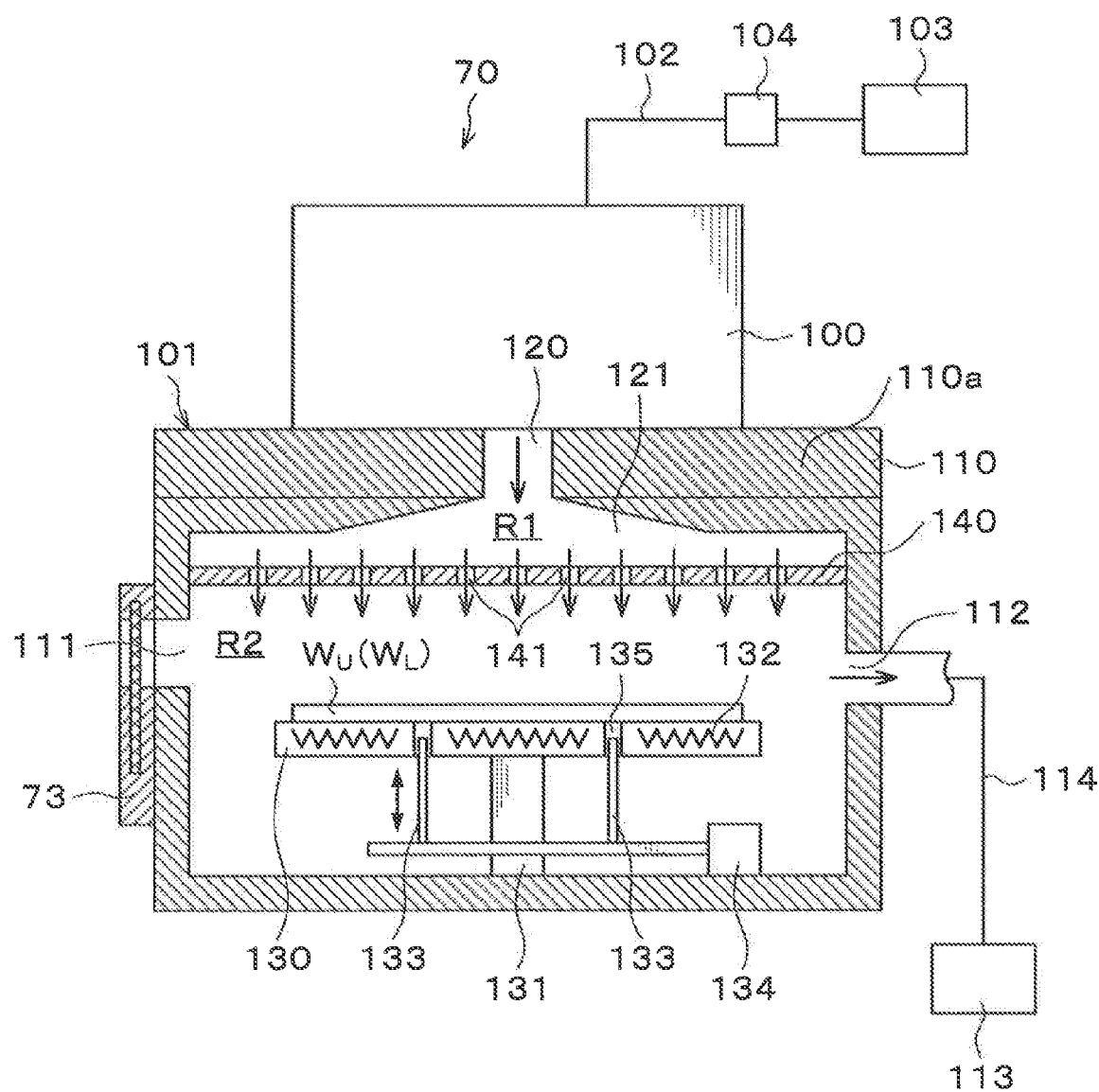
FIG. 6 A longitudinal sectional view illustrating the outline of the configuration of a processing unit.

The processing part 70 has a radical generation unit 100 generating radicals by plasma-exciting a processing gas and a processing unit 101 activating the front surface $W_{U1}$, $W_{L1}$ of the wafer $W_U$, $W_L$ using the radicals generated in the radical generation unit 100 as illustrated in FIG. 6. The radical generation unit 100 is placed on the processing unit 101.

To the radical generation unit 100, a supply pipe 102 is connected which supplies the processing gas to the radical generation unit 100. The supply pipe 102 communicates with a processing pas supply source 103. Further, along the supply pipe 102, a supply equipment group 104 is provided which includes a valve, a flow regulator and so on for controlling the flow of the processing gas. Note that as the processing gas, for example, an oxygen gas, a nitrogen gas, and an argon gas are used.

The processing unit 101 has a processing container 110 which can hermetically close the inside. A transfer-in/out port 111 for the wafers $W_U$, $W_L$ is formed in a side surface on the transfer part 72 side of the processing container 110, and the above-described gate valve 73 is provided at the transfer-in/out port 111. Further, a suction port 112 is formed in another side surface of the processing container 110. To the suction port 112, a suction pipe 114 is connected which communicates with a vacuum pump 113 reducing the pressure of the atmosphere inside the processing container 110 down to a predetermined vacuum degree.

At a ceiling plate 110a of the processing container 110, a radical supply port 121 is formed for supplying the radicals generated in the radical generation unit 100 into the processing container 110 via the supply pipe 120. The lower portion of the supply pipe 120 is enlarged in a tapered shape from the top to the bottom, and the lower end face of the supply pipe 120 forms the radical supply port 121.

Inside the processing container 110 and below the radical supply port 121, a thermal processing plate 130 is provided which mounts and thermally processes the wafer $W_U$, $W_L$ thereon. The thermal processing plate 130 is supported by a supporting member 131. In the thermal processing plate 130, a heater 132 generating heat, for example, by power feeding is embedded. The heating temperature of the thermal processing plate 130 is controlled, for example, by a later-described control unit 300 so that the wafer $W_U$, $W_L$ mounted on the thermal processing plate 130 is maintained at a predetermined temperature.

Below the thermal processing plate 130, for example, three raising and lowering pins 133 are provided for supporting the wafer $W_U$, $W_L$ from below and raising and lowering the wafer $W_U$, $W_L$. The raising and lowering pins 133 can move up and down by means of a raising and lowering drive part 134. Near the middle portion of the thermal processing plate 130, through holes 135 penetrating the thermal processing plate 130 in the thickness direction are formed, for example, at three positions. The raising and lowering pins 133 are inserted into the through holes 135 to be able to project from the upper surface of the thermal processing plate 130.

Figure 7:
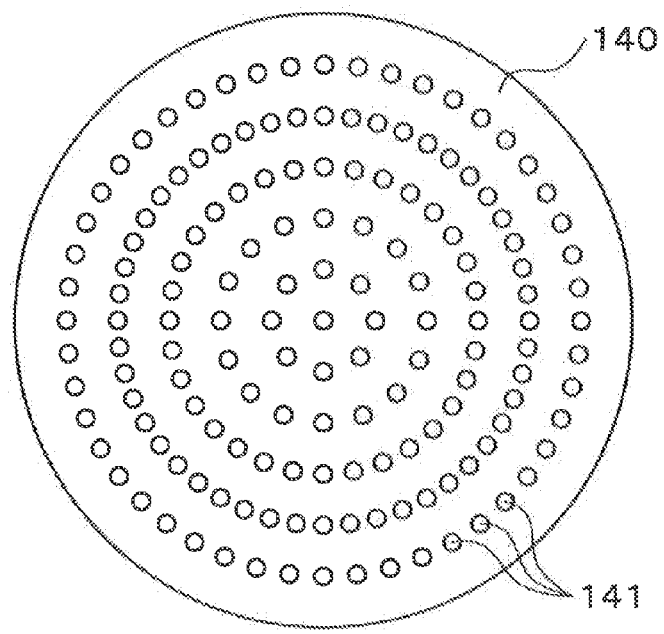
FIG. 7 A plan view of a thermal processing plate.

Between the radical supply port 121 and the thermal processing plate 130, a radical introduction plate 140 is provided which divides the inside of the processing container 110 into a radical supply region R1 on the radical supply port 121 side and a processing region R2 on the thermal processing plate 130 side. In the radical introduction plate 140, a plurality of through holes 141 for causing radicals pass through are formed uniformly in the horizontal plane as illustrated in FIG. 7. Then, as illustrated in FIG. 6, the radicals supplied from the radical supply port 121 to the radical supply region R1 are uniformly diffused within the horizontal plane when passing through the radical introduction plate 140, and introduced into the processing region R2. Note that for the radical introduction plate 140, for example, quartz is used.

Figure 8:
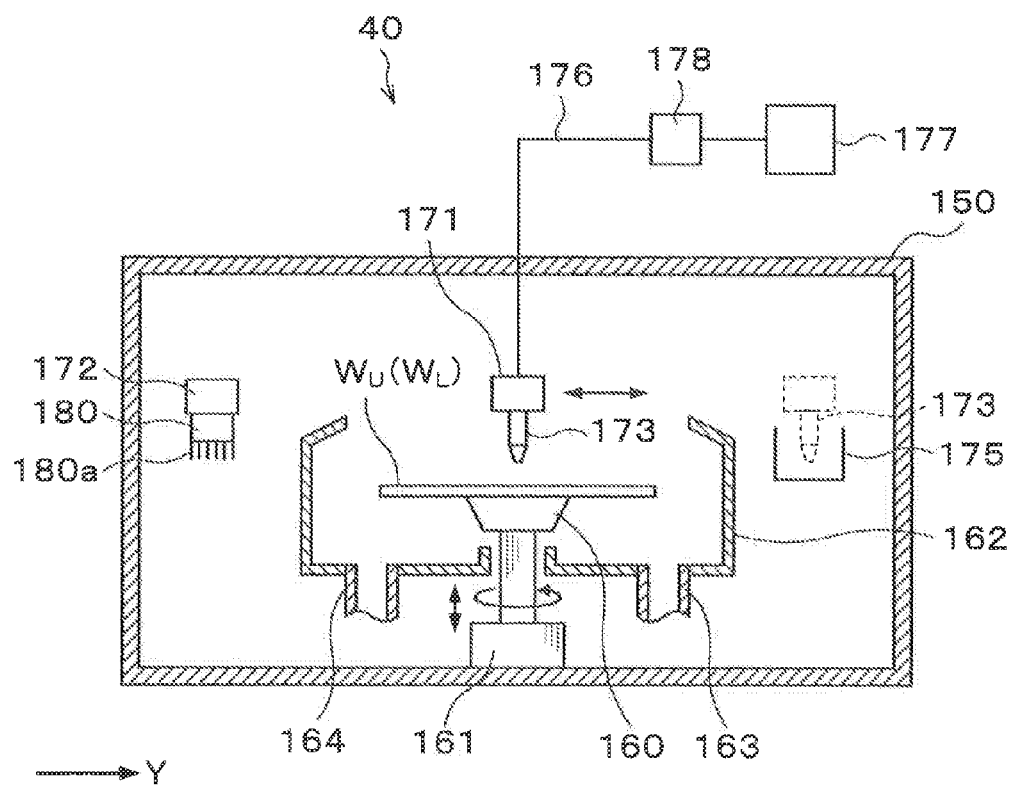
FIG. 8 A longitudinal sectional view illustrating the outline of the configuration of a surface hydrophilizing apparatus.

Next, the configuration of the aforementioned surface hydrophilizing apparatus 40 will be described. The surface hydrophilizing apparatus 40 has a treatment container 150 which can hermetically close the inside as illustrated in FIG. 8. A transfer-in/out port 151 for the wafers $W_U$, $W_L$ is formed in a side surface on the wafer transfer region 60 side of the treatment container 150, and an opening/closing shutter 152 is provided at the transfer-in/out port 151.

At the middle portion in the treatment container 150, a spin chuck 160 is provided which holds and rotates the wafer $W_U$, $W_L$ thereon as illustrated in FIG. 8. The spin chuck 160 has a horizontal upper surface, and a suction port (not illustrated) sucking, for example, the wafer $W_U$, $W_L$ is provided in the upper surface. By suction through the suction port, the wafer W can be suction-held on the spin chuck 160.

The spin chuck 160 has a chuck drive part 161 equipped with, for example, a motor and can rotate at a predetermined speed by means of the chuck drive part 161. Further, the chuck drive part 161 is provided with a raising and lowering drive source such as, for example, a cylinder so that the spin chuck 160 can freely rise and lower.

Around the spin chuck 160, a cup 162 is provided which receives and collects liquid splashing or dropping from the wafer $W_U$, $W_L$. A drain pipe 163 draining the collected liquid and an exhaust pipe 164 vacuuming and exhausting the atmosphere in the cup 162 are connected to the lower surface of the cup 162. Note that an air current directed vertically downward called downflow is generated inside the treatment container 150. Then, the exhaust pipe 164 exhausts also the atmosphere inside the treatment container 150.

Figure 9:
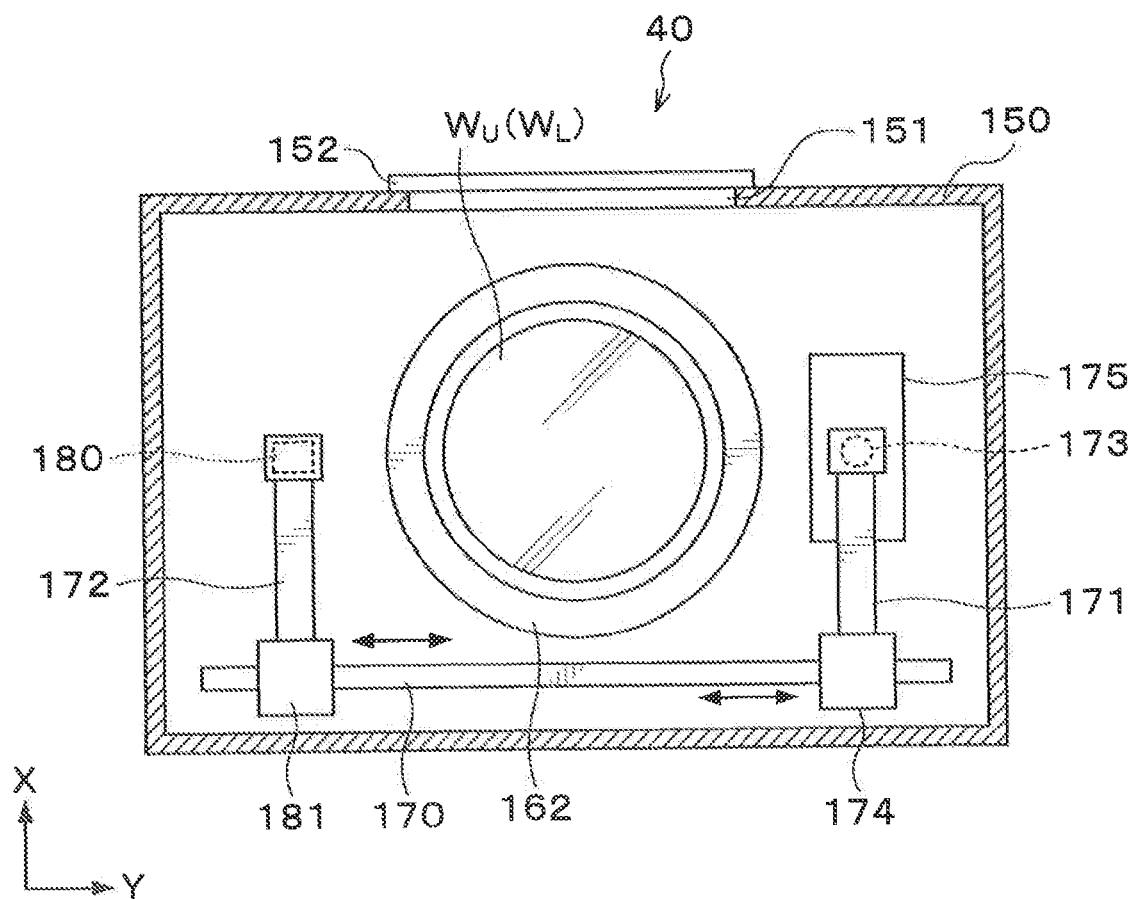
FIG. 9 A transverse sectional view illustrating the outline of the configuration of the surface hydrophilizing apparatus.

As illustrated in FIG. 9, on an X-direction negative direction (a lower direction in FIG. 9) side of the cup 162, a rail 170 extending along a Y-direction (a right-left direction in FIG. 9) is formed. The rail 170 is formed, for example, from a Y-direction negative direction (a left direction in FIG. 9) side outer position of the cup 162 to a Y-direction positive direction (a right direction in FIG. 9) side outer position. On the rail 170, for example, a nozzle arm 171 and a scrub arm 172 are attached on the rail 170.

On the nozzle arm 171, a pure water nozzle 173 is supported which supplies pure water to the wafer $W_U$, $W_L$ as illustrated in FIG. 8 and FIG. 9. The nozzle arm 171 is movable on the rail 170 by means of a nozzle drive part 174 illustrated in FIG. 9. Thus, the pure water nozzle 173 can move from a waiting section 175 provided at a Y-direction positive direction side outer position of the cup 162 to a position above a central portion of the wafer $W_U$, $W_L$ in the cup 162, and further move in the diameter direction of the wafer $W_U$, $W_L$ above the wafer $W_U$, $W_L$. Further, the nozzle arm 171 can freely rise and lower by means of the nozzle drive part 174 to be able to adjust the height of the pure water nozzle 173.

To the pure water nozzle 173, a supply pipe 176 supplying the pure water to the pure water nozzle 173 is connected as illustrated in FIG. 8. The supply pipe 176 communicates with a pure water supply source 177 storing the pure water therein. Further, along the supply pipe 176, a supply equipment group 178 is provided which includes a valve, a flow regulator and so on for controlling the flow of the pure water.

On the scrub arm 172, a scrub cleaning tool 180 is supported. At the tip of the scrub cleaning tool 180, a brush 180a in the shape of plurality threads or sponge is provided. The scrub arm 172 is movable on the rail 170 by means of a cleaning tool drive part 181 illustrated in FIG. 9, and can move the scrub cleaning tool 180 from a Y-direction negative direction side outer position of the cup 162 to a position above a central portion of the wafer $W_U$, $W_L$ in the cup 162. Further, the scrub arm 172 can freely rise and lower by means of the cleaning tool drive part 181 to be able to adjust the height of the scrub cleaning tool 180.

Note that the pure water nozzle 173 and the scrub cleaning tool 180 are supported on separate arms in the above configuration, but may be supported on the same arm. Further, the pure water nozzle 173 may be omitted, and pure water may be supplied from the scrub cleaning tool 180. Furthermore, the cup 162 may be omitted, and a discharge pipe discharging liquid and an exhaust pipe exhausting the atmosphere in the treatment container 150 may be connected to the bottom surface of the treatment container 150. Moreover, an ionizer (not illustrated) for preventing static charge may be provided in the surface hydrophilizing apparatus 40 having the above configuration.

Figure 10:
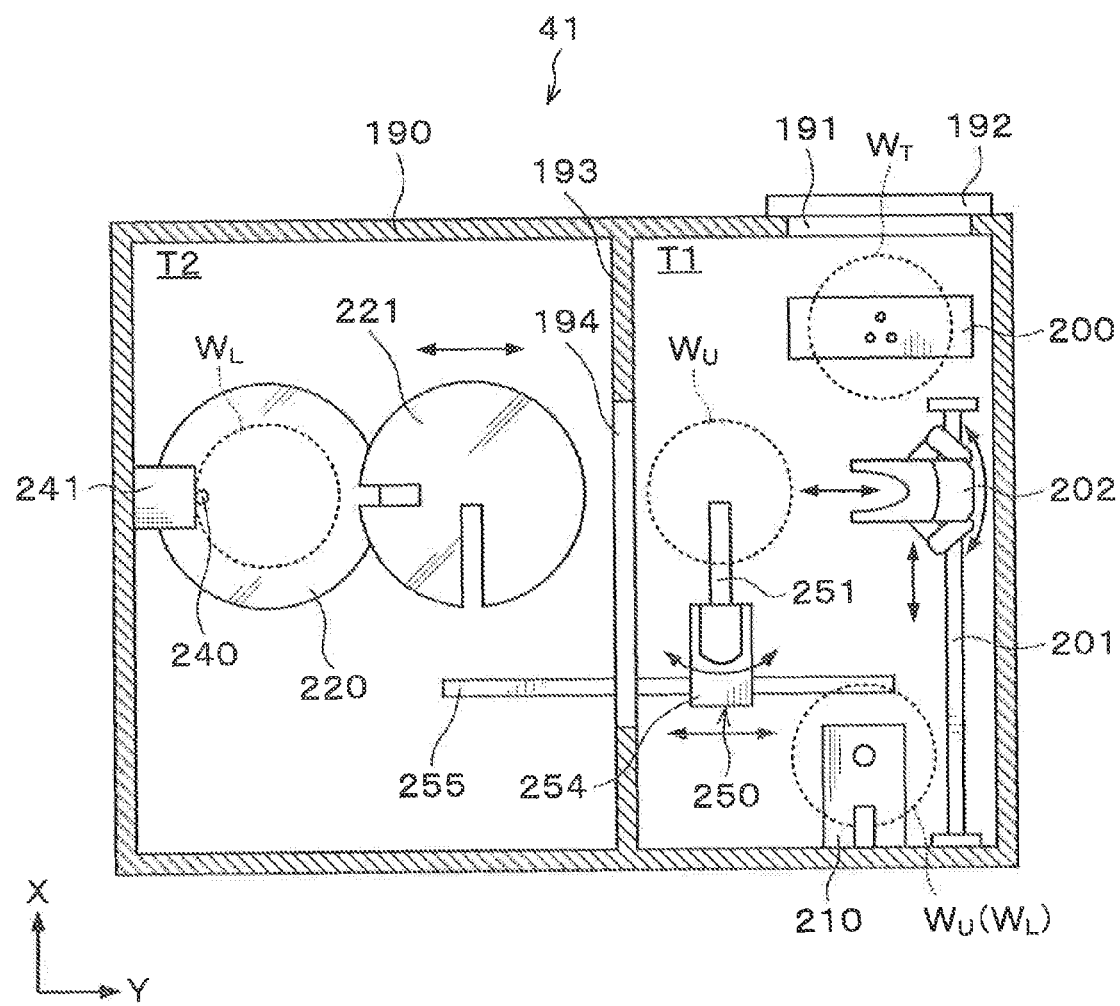
FIG. 10 A transverse sectional view illustrating the outline of the configuration of a joint apparatus.

Next, the configuration of the aforementioned joint apparatus 41 will be described. The joint apparatus 41 has a processing container 190 which can hermetically close the inside as illustrated in FIG. 10. A transfer-in/out port 191 for the wafers $W_U$, $W_L$ and the superposed wafer $W_T$ is formed in a side surface on the wafer transfer region 60 side of the processing container 190, and an opening/closing shutter 192 is provided at the transfer-in/out port 191. Note that an air current directed vertically downward called downflow is generated inside the treatment container 190. Then, the atmosphere inside the treatment container 190 is exhausted from an exhaust port (not illustrated).

The inside of the processing container 190 is divided by an inner wall 193 into a transfer region T1 and a processing region T2. The above-described transfer-in/out port 191 is formed in the side surface of the processing container 190 in the transfer region T1. Further, a transfer-in/out port 194 for the wafers $W_U$, $W_L$ and the superposed wafer $W_T$ is formed also in the side wall 193.

On an X-direction positive direction side in the transfer region T1, a transition 200 is provided for temporarily mounting the wafer $W_U$, $W_L$ or the superposed wafer $W_T$ thereon. Two transitions 200 are formed, for example, at two tiers and can mount any two of the wafers $W_U$, $W_L$ and the superposed wafer $W_T$ at the same time.

In the transfer region T1, a wafer transfer body 202 is provided which is movable on a transfer path 201 extending in an X-direction. The wafer transfer body 202 is also movable in the vertical direction and around the vertical axis as illustrated in FIG. 10 and FIG. 11, and can transfer the wafer $W_U$, $W_L$ or the superposed wafer $W_T$ in the transfer region T1 or between the transfer region T1 and the processing region T2.

Figure 12:
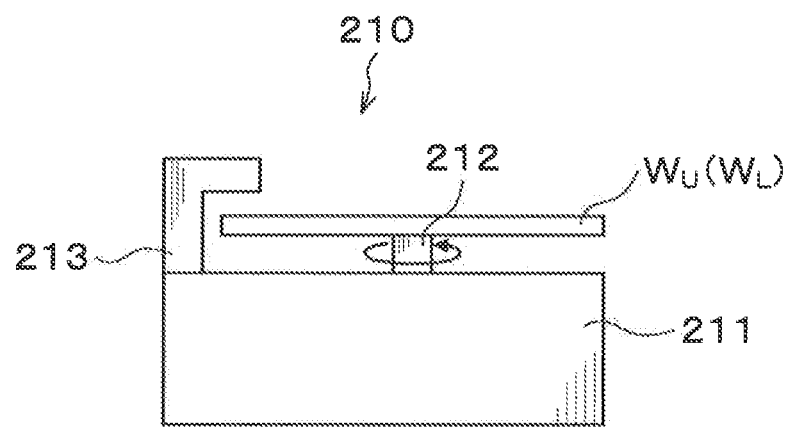
FIG. 12 A side view of a position adjusting mechanism.

On an X-direction negative direction side in the transfer region T1, a position adjusting mechanism 210 is provided which adjusts the orientation in the horizontal direction of the wafer $W_U$, $W_L$. The position adjusting mechanism 210 has a base 211, a holding part 212 suction-holding and rotating the wafer $W_U$, $W_L$ thereon, and a detection part 213 detecting the position of a notch portion of the wafer $W_U$, $W_L$ as illustrated in FIG. 12. Then, in the position adjusting mechanism 210, the position of the notch portion of the wafer $W_U$, $W_L$ is detected by the detection part 213 while the wafer $W_U$, $W_L$ suction-held by the holding part 212 is being rotated, whereby the position of the notch portion is adjusted to adjust the orientation in the horizontal direction of the wafer $W_U$, $W_L$.

Figure 11:
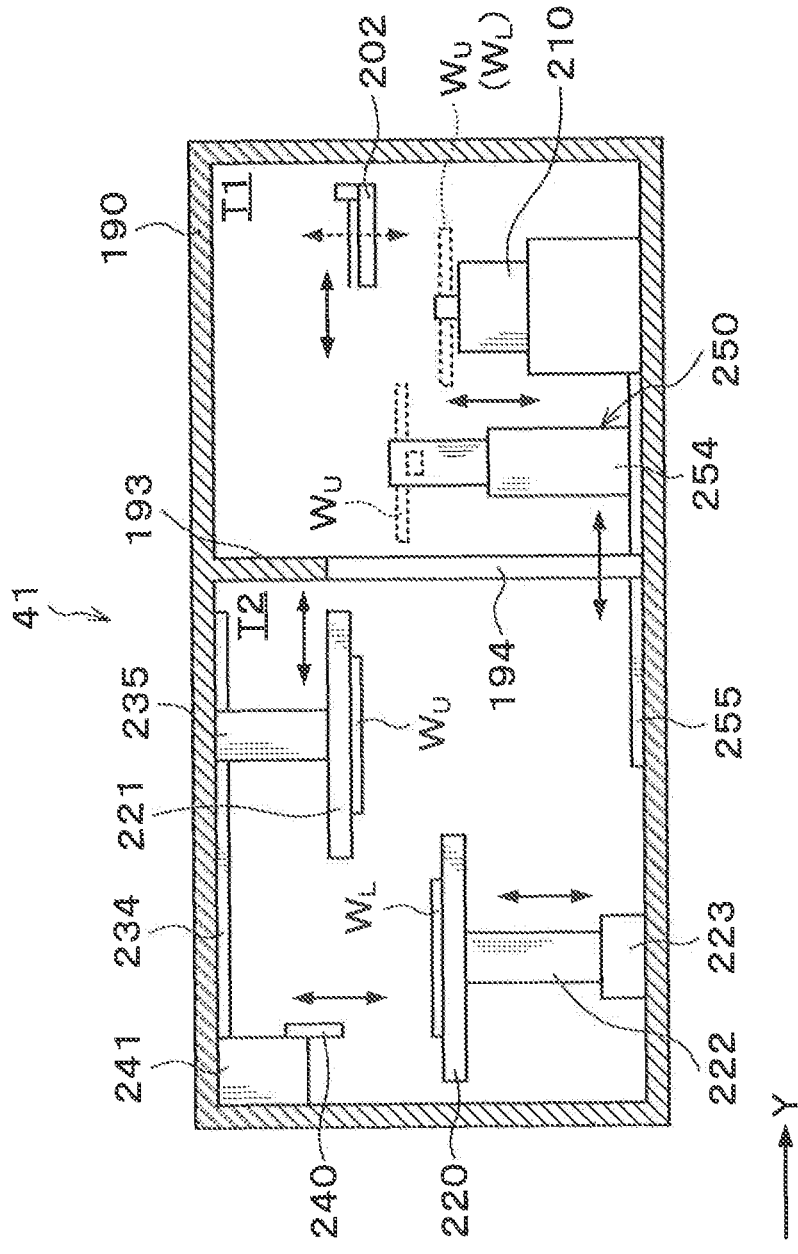
FIG. 11 A longitudinal sectional view illustrating the outline of the configuration of the joint apparatus.

In the processing region T2, a lower chuck 220 mounting and holding on its upper surface the lower wafer $W_L$ and an upper chuck 221 mounting and holding on its lower surface the upper wafer $W_U$ are provided as illustrated in FIG. 10 and FIG. 11. The upper chuck 221 is provided above the lower chuck 220 and configured to face the lower chuck 220. In other words, the lower wafer $W_L$ held by the lower chuck 220 and the upper wafer $W_U$ held by the upper chuck 221 can be arranged to face each other.

Inside the lower chuck 220, a suction pipe (not illustrated) communicating with a vacuum pump (not illustrated) is provided. By suction through the suction pipe, the lower wafer $W_L$ can be suction-held on the upper surface of the lower chuck 220.

Below the lower chuck 220, a chuck drive part 223 is provided via a shaft 222 as illustrated in FIG. 11. By means of the chuck drive part 223, the lower chuck 220 can freely rise and lower. Note that the lower chuck 220 may be movable in the horizontal direction and rotatable around the vertical axis by means of the chuck drive part 223.

Figure 13:
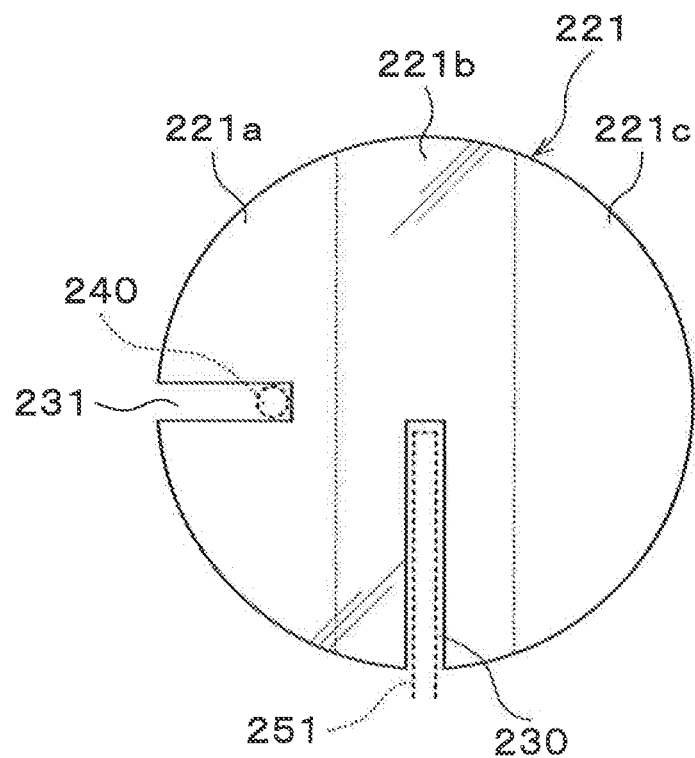
FIG. 13 A plan view of an upper chuck.

The upper chuck 221 is formed with two cutout portions 230, 231 as illustrated in FIG. 13. The first cutout portion 230 is formed so that the upper chuck 221 does not interfere with a holding arm 251 of a later-described reversing mechanism 250. Further, the second cutout portion 231 is formed so that the upper chuck 221 does not interfere with a later-described pressing and moving member 240.

Figure 14:
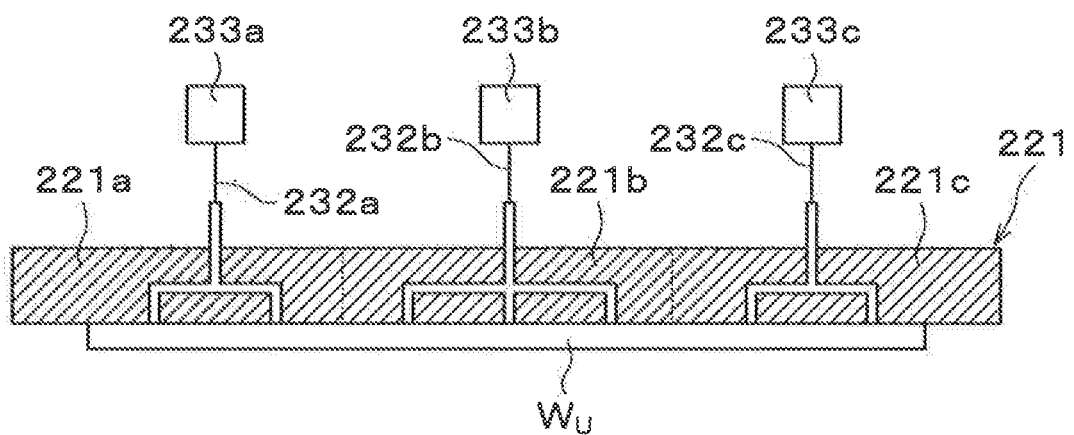
FIG. 14 A longitudinal sectional view of the upper chuck.

The inside of the upper chuck 221 is divided into a plurality of, for example, three regions 221a, 221b, 221c as illustrated in FIG. 14. In the regions 221a, 221b, 221c, suction pipes 232a, 232b, 232c are independently provided for suction-holding the upper wafer $W_U$. To the suction pipes 232a, 232b, 232c, different vacuum pumps 233a, 233b, 233c are connected respectively. Accordingly, the upper chuck 221 is configured such that vacuuming of the upper wafer $W_U$ can be set for each of the regions 221a, 221b, 221c.

Above the upper chuck 221, a rail 234 extending in a Y-direction is provided as illustrated in FIG. 11. The upper chuck 221 is movable on the rail 234 by means of a chuck drive part 235. Note that the upper chuck 221 may be movable in the vertical direction and rotatable around the vertical axis by means of the chuck drive part 235.

In the processing region T2, the pressing and moving member 240 is provided as illustrated in FIG. 10 and FIG. 11. The pressing and moving member 240 is configured to be able to freely rise and lower by means of a drive part 241 such as a cylinder. The pressing and moving member 240 can bring one end portion of the lower wafer $W_L$ and one end portion of the upper wafer $W_U$ facing the one end portion of the lower wafer $W_L$ into abutment with each other and press them at the later-described joint of the wafers $W_U$ and $W_L$ together.

Figure 15:
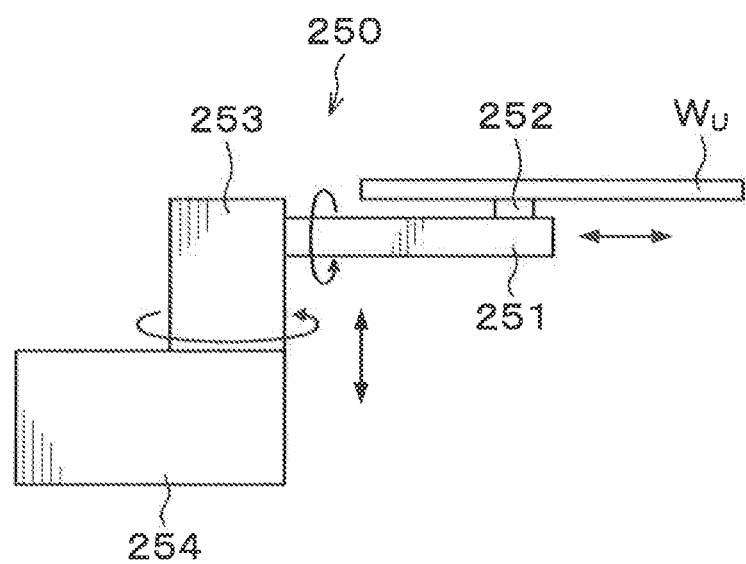
FIG. 15 A side view of a reversing mechanism.

In the transfer region T1, the reversing mechanism 250 moving between the transfer region T1 and the processing region T2 and reversing the front and rear surfaces of the upper wafer $W_U$ is provided. The reversing mechanism 250 has a holding arm 251 holding the upper wafer $W_U$ as illustrated in FIG. 15. On the holding arm 251, a suction pad 252 is provided which sucks and horizontally holds the upper wafer $W_U$. The holding arm 251 is supported on a first drive part 253. By means of the first drive part 253, the holding arm 251 can freely turn around the horizontal axis and expand and contract in the horizontal direction. Below the first drive part 253, a second drive part 254 is provided. By means of the second drive part 254, the first drive part 253 is rotatable around the vertical axis and can rise and lower in the vertical direction. Further, the second drive part 254 is attached to a rail 255 extending in the Y-direction illustrated in FIG. 10 and FIG. 11. The rail 255 extends from the processing region T2 to the transfer region T1. By means of the second drive part 254, the reversing mechanism 250 is movable along the rail 255 between the position adjusting mechanism 210 and the upper chuck 221. Note that the configuration of the reversing mechanism 250 is not limited to that of the above embodiment, but only needs to be able to reverse the front and rear surfaces of the upper wafer $W_U$. Further, the reversing mechanism 250 may be provided in the processing region T2. Further, a reversing mechanism may be given to the wafer transfer body 202 and another transfer means may be provided at the position of the reversing mechanism 250.

Note that in the processing region T2, a later-described lower image-pickup member picking up an image of the front surface $W_{L1}$ of the lower wafer $W_L$ and a later-described upper image-pickup member picking up an image of the front surface $W_{U1}$ of the upper wafer $W_U$ are provided to perform position adjustment in the horizontal direction of the lower wafer $W_L$ held by the lower chuck 220 and the upper wafer $W_U$ held by the upper chuck 221 as will be described later. As the lower image-pickup member and the upper image-pickup member, for example, a wide-angle CCD camera is used.

In the above joint system 1, a control unit 300 is provided as illustrated in FIG. 1. The control unit 300 is, for example, a computer and has a program storage part (not illustrated). In the program storage part, a program is stored which controls the processing of the wafers $W_U$, $W_L$ and the superposed wafer $W_T$ in the joint system 1. Further, the program storage part also stores a program for controlling the operation of the driving system of the above-described various processing apparatuses and transfer apparatuses to realize the later-described joint processing in the joint system 1. Note that the programs may be the ones which are stored, for example, in a computer-readable storage medium H such as a computer-readable hard disk (HD), flexible disk (FD), compact disk (CD), magneto-optical disk (MO), or memory card, and installed from the storage medium H into the control unit 300.

Figure 16:
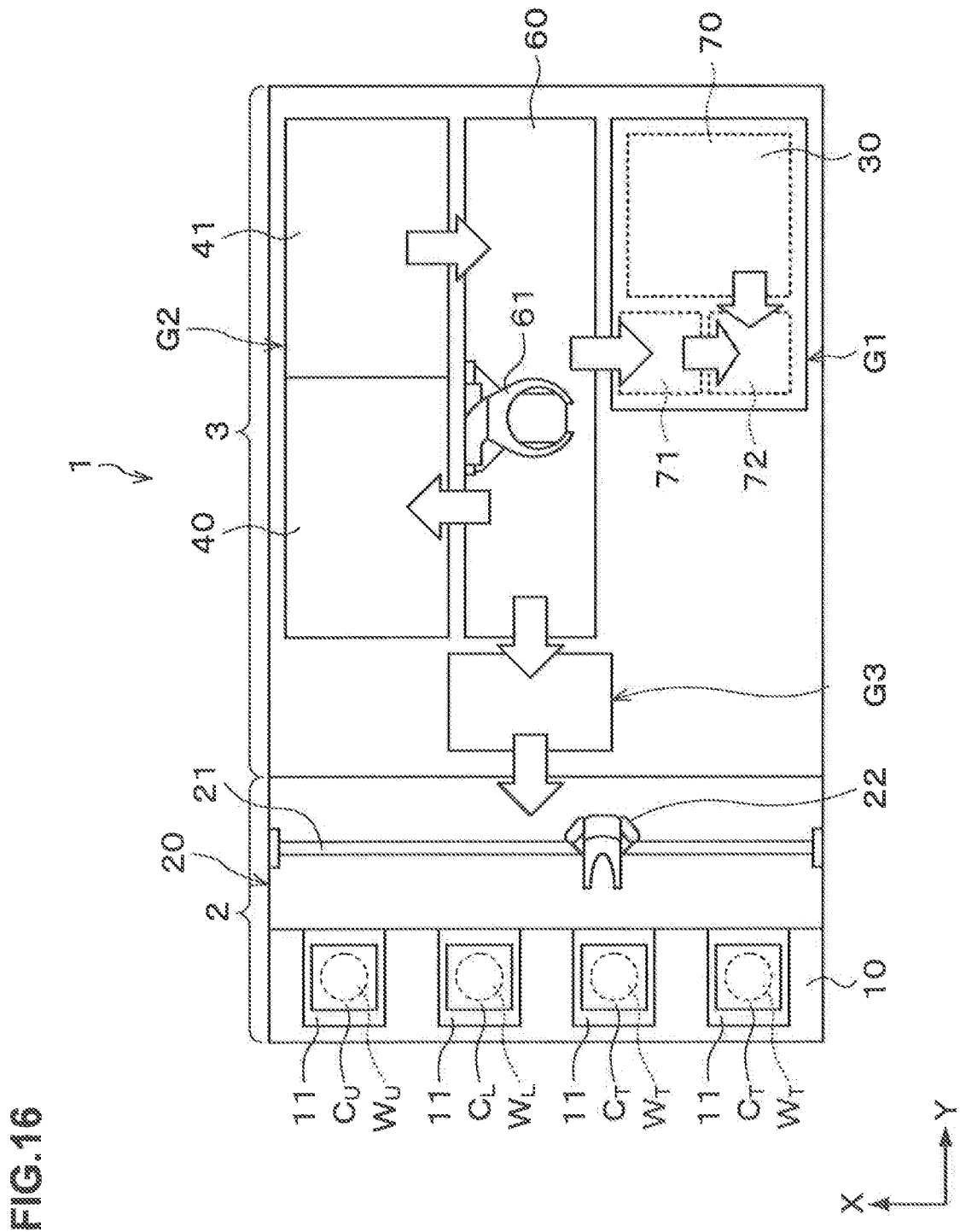
FIG. 16 An explanatory view of air currents generated in the joint system.

Next, the air currents generated in the joint system 1 when performing the joint processing of the wafers $W_U$, $W_L$ in the joint system 1 configured as described above will be described based on FIG. 16. Note that arrows in FIG. 16 indicate the directions of the air currents.

In the joint system 1, the pressure inside the joint apparatus 41 becomes the highest. Therefore, the pressure inside the joint apparatus 41 is positive with respect to the pressure inside the wafer transfer region 60, so that when the opening/closing shutter 192 of the joint apparatus 41 is opened, an air current directed from the joint apparatus 41 to the wafer transfer region 60 is generated.

The pressure inside the wafer transfer region 60 is positive with respect to the pressure inside the surface activation apparatus 30, the pressure inside the surface hydrophilizing apparatus 40, the pressure inside the third processing block G3, and the pressure inside the transfer-in/out station 2. Therefore, when the opening/closing shutters 83, 152 and so on are opened, air currents directed from the wafer transfer region 60 to the surface activation apparatus 30, the surface hydrophilizing apparatus 40, the third processing block G3, and the transfer-in/out station 2 are generated. Note that the pressure inside the third processing block G3 is positive with respect to the pressure inside the transfer-in/out station 2.

Furthermore, in the surface activation apparatus 30, the pressure inside the processing part 70 and the pressure inside the transfer-in/out part 71 are positive with respect to the pressure inside the transfer part 72. In other words, when the gate valve 73 is opened, an air current directed from the processing part 70 to the transfer part 72 is generated due to the suction through the suction port (not illustrated). Note that during the time when the gate valve 73 is opened, a nitrogen gas may be aggressively streamed from the processing part 70 to the transfer part 72 to generate an air current. Further, when the opening/closing shutters 84 are opened, an air current directed from the transfer-in/out part 71 to the transfer part 72 is also generated.

Figure 17:
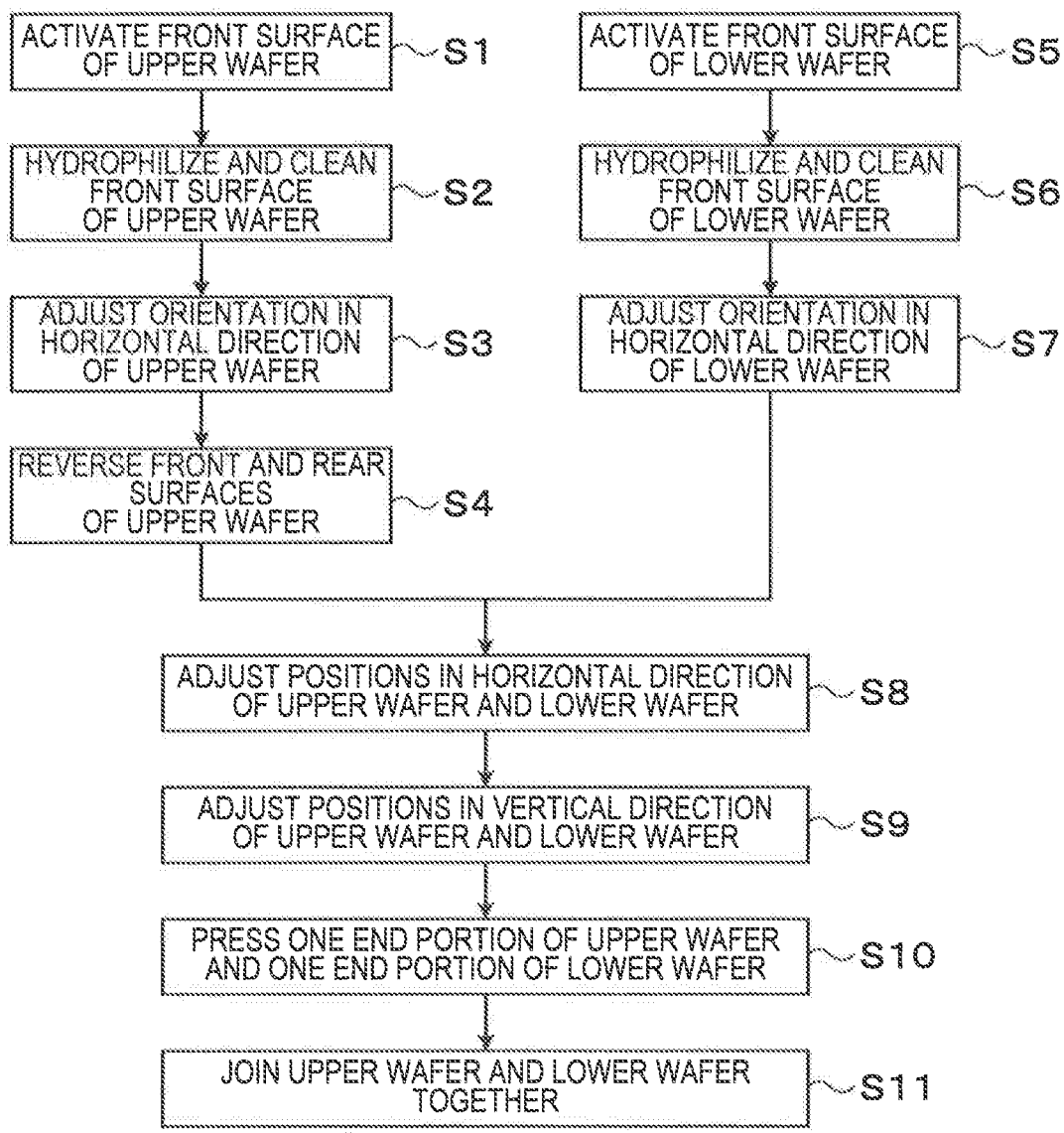
FIG. 17 A flowchart illustrating main steps of wafer joint processing.

Next, the joint processing method of the wafers $W_U$, $W_L$ performed using the joint system 1 configured as described above will be described. FIG. 17 is a flowchart illustrating an example of main steps of the wafer joint processing.

First, a cassette $C_U$ housing a plurality of upper wafers $W_U$, a cassette $C_L$ housing a plurality of lower wafers $W_L$, and an empty cassette $C_T$ are mounted on the predetermined cassette mounting plates 11 in the transfer-in/out station 2. Then, an upper wafer $W_U$ in the cassette $C_U$ is taken out by the wafer transfer apparatus 22 and transferred to the transition apparatus 50 in the third processing block G3 in the processing station 3.

Subsequently, the upper wafer $W_U$ is transferred by the wafer transfer apparatus 61 to the surface activation apparatus 30 in the first processing block G1. The upper wafer $W_U$ transferred into the surface activation apparatus 30 is transferred by the wafer transfer body 90 to the processing unit 101 via the transition unit 80.

In the processing unit 101, the gate valve 73 is opened first, and the upper wafer $W_U$ is then transferred thereinto to above the thermal processing plate 130 by the wafer transfer body 90. Subsequently, the raising and lowering pins 133 are raised and the upper wafer $W_U$ is delivered from the wafer transfer body 90 to the raising and lowering pins 133, and the raising and lowering pins 133 are then lowered to mount the upper wafer $W_U$ on the thermal processing plate 130. Thereafter, the upper wafer $W_U$ on the thermal processing plate 130 is maintained at a predetermined temperature, for example, 25° C. to 300° C. In this event, the gate valve 73 is closed and the pressure of the atmosphere inside the processing container 110 is reduced by the vacuum pump 113 to a predetermined degree of vacuum, for example, 67 Pa to 333 Pa (0.5 Torr to 2.5 Torr).

In the radical generation unit 100, radicals are generated by plasma-exciting a processing gas, for example, an oxygen gas, a nitrogen gas, and an argon gas. Thereafter, the radicals generated in the radical generation unit 100 are supplied into the radical supply region R1 in the processing container 110 of the processing unit 101 via the supply pipe 120 and the supply port 121. The supplied radicals pass through the radical introduction plate 140 to be uniformly diffused within the horizontal plane, and introduced into the processing region R2.

With the radicals, an organic substance on the front surface $W_{U1}$ of the upper wafer $W_U$ on the thermal processing plate 130 is removed. In this event, the radicals of the oxygen gas mainly contribute to the removal of the organic substance on the front surface $W_{U1}$. Further, the radicals of the oxygen gas can also accelerate oxidation, namely, hydrophilization of the front surface $W_{U1}$ of the upper wafer $W_U$. Further, the plasma of the argon gas has high energy to a certain degree, and therefore the radicals of the argon gas aggressively (physically) remove the organic substance on the front surface $W_{U1}$. Furthermore, the radicals of the argon gas have an effect of removing residual moisture contained in the atmosphere inside the processing container 110. In this manner, the front surface $W_{U1}$ of the upper wafer $W_U$ is activated (Step S1 in FIG. 17).

Thereafter, the gate valve 73 is opened, and the raising and lowering pins 133 are raised to deliver the upper wafer $W_U$ from the raising and lowering pins 133 to the wafer transfer body 90. Thereafter, the upper wafer $W_U$ is transferred by the wafer transfer body 90 to the temperature-adjustment unit 81 and temperature-adjusted to a predetermined temperature, for example, 25° C. Note that when the upper wafer $W_U$ is transferred out of the processing unit 101, the inside of the processing container 110 is purged with, for example, a nitrogen gas.

Then, the upper wafer $W_U$ is transferred by the wafer transfer apparatus 61 to the surface hydrophilizing apparatus 40 in the second processing block G2. The upper wafer $W_U$ transferred into the surface hydrophilizing apparatus 40 is delivered from the wafer transfer apparatus 61 to the spin chuck 160 and suction-held thereon.

Subsequently, the nozzle arm 171 moves the pure water nozzle 173 at the waiting section 175 to a position above the central portion of the upper wafer $W_U$, and the scrub arm 172 moves the scrub cleaning tool 180 to above the upper wafer $W_U$. Thereafter, pure water is supplied from the pure water nozzle 173 onto the upper wafer $W_U$ while the spin chuck 160 is rotating the upper wafer $W_U$. Then, hydroxyls adhere to the front surface $W_{U1}$ of the upper wafer $W_U$, whereby the front surface $W_{U1}$ is hydrophilized. Further, the front surface $W_{U1}$ of the upper wafer $W_U$ is cleaned with the pure water from the pure water nozzle 173 and the scrub cleaning tool 180 (Step S2 in FIG. 17).

Then, the upper wafer $W_U$ is transferred by the wafer transfer apparatus 61 to the joint apparatus 41 in the second processing block G2. The upper wafer $W_U$ transferred into the joint apparatus 41 is transferred by the wafer transfer body 202 to the position adjusting mechanism 210 via the transition 200. Then, the orientation in the horizontal direction of the upper wafer $W_U$ is adjusted by the position adjusting mechanism 210 (Step S3 in FIG. 17).

Then, the upper wafer $W_U$ is delivered from the position adjusting mechanism 210 to the holding arm 251 of the reversing mechanism 250. Subsequently, in the transfer region T1, the holding arm 251 is reversed to reverse the front and rear surfaces of the upper wafer $W_U$ (Step S4 in FIG. 17). In short, the front surface $W_{U1}$ of the upper wafer $W_U$ is directed downward. Thereafter, the reversing mechanism 250 moves to the upper chuck 221 side and the upper wafer $W_U$ is delivered from the reversing mechanism 250 to the upper chuck 221. The upper wafer $W_U$ is suction-held by the upper chuck 221 at the rear surface $W_{U2}$. Thereafter, the upper chuck 221 is moved by the chuck drive part 235 to a position above the lower chuck 220 and facing the lower chuck 220. The upper wafer $W_U$ then waits on the upper chuck 221 until the later-described lower wafer $W_L$ is transferred to the joint apparatus 41. Note that the reversal of the front and rear surfaces of the upper wafer $W_U$ may be performed during the movement of the reversing mechanism 250.

During the time when the above-described processing at Steps S1 to S4 is performed on the upper wafer $W_U$, processing on the lower wafer $W_L$ is performed subsequent to the upper wafer $W_U$. First, a lower wafer $W_L$ in the cassette $C_L$ is taken out by the wafer transfer apparatus 22 and transferred to the transition apparatus 50 in the processing station 3.

Subsequently, the lower wafer $W_L$ is transferred by the wafer transfer apparatus 61 to the surface activation apparatus 30, and the front surface $W_{L1}$ of the lower wafer $W_L$ is activated (Step 5 in FIG. 17). Note that the activation of the front surface $W_{L1}$ of the lower wafer $W_L$ at Step S5 is the same as the above-described Step S1, and therefore the detailed description thereof will be omitted.

Then, the lower wafer $W_L$ is transferred by the wafer transfer apparatus 61 to the surface hydrophilizing apparatus 40, and the front surface $W_{L1}$ of the lower wafer $W_L$ is hydrophilized and the front surface $W_{L1}$ is cleaned (Step S6 in FIG. 17). Note that hydrophilizing and cleaning of the front surface $W_{L1}$ of the lower wafer $W_L$ at Step S6 is the same as the above-described Step S2, and therefore the detailed description will be omitted.

Then, the lower wafer $W_L$ is transferred by the wafer transfer apparatus 61 to the joint apparatus 41. The lower wafer $W_L$ transferred into the joint apparatus 41 is transferred by the wafer transfer body 202 to the position adjusting mechanism 210 via the transition 200. Then, the orientation in the horizontal direction of the lower wafer $W_L$ is adjusted by the position adjusting mechanism 210 (Step S7 in FIG. 17).

Subsequently, the lower wafer $W_L$ is transferred by the wafer transfer body 202 to the lower chuck 220 and suction-held by the lower chuck 220. In this event, the rear surface $W_{L2}$ of the lower wafer $W_L$ is held by the lower chuck 220 so that the front surface $W_{L1}$ of the lower wafer $W_L$ is directed upward. Note that a groove (not illustrated) conforming to the shape of the wafer transfer body 202 may be formed in the upper surface of the lower chuck 220 so as to prevent interference between the wafer transfer body 202 and the lower chuck 220 when delivering the lower wafer $W_L$.

Figure 18:
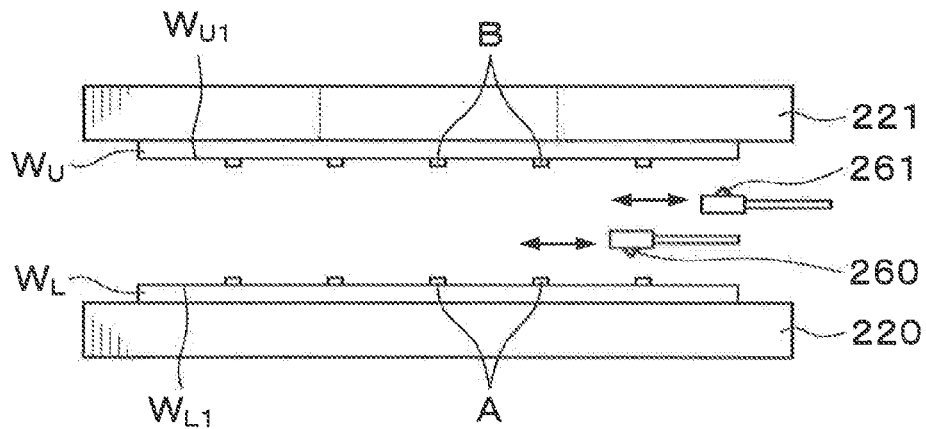
FIG. 18 An explanatory view illustrating the appearance that the positions in the horizontal direction of the upper wafer and the lower wafer are adjusted.

Then, position adjustment in the horizontal direction of the lower wafer $W_L$ held by the lower chuck 220 and the upper wafer $W_U$ held by the upper chuck 221 is performed. As illustrated in FIG. 18, a plurality of predetermined reference points A are formed on the front surface $W_{L1}$ of the lower wafer $W_L$, and a plurality of predetermined reference points B are similarly formed on the front surface $W_{U1}$ of the upper wafer $W_U$. Then, the lower image-pickup member 260 is moved in the horizontal direction and an image of the front surface $W_{L1}$ of the lower wafer $W_L$ is picked up. Further, the upper image-pickup member 261 is moved in the horizontal direction and an image of the front surface $W_{U1}$ of the upper wafer $W_U$ is picked up. Thereafter, the position in the horizontal direction of the upper wafer $W_U$ is adjusted by the upper chuck 221 so that the positions of the reference points A on the lower wafer $W_L$ indicated in the image picked up by the lower image-pickup member 260 coincide with the positions of the reference points B on the upper wafer $W_U$ indicated in the image picked up by the upper image-pickup member 261. In this manner, the positions in the horizontal direction of the upper wafer $W_U$ and the lower wafer $W_L$ are adjusted (Step S8 in FIG. 17). Note that if the lower chuck 220 is movable in the horizontal direction by the chuck drive part 223, the position in the horizontal direction of the lower wafer $W_L$ may be adjusted by the lower chuck 220, or the relative positions in the horizontal direction of the lower wafer $W_L$ and the upper wafer $W_U$ may be adjusted by both of the lower chuck 220 and the upper chuck 221.

Figure 19:
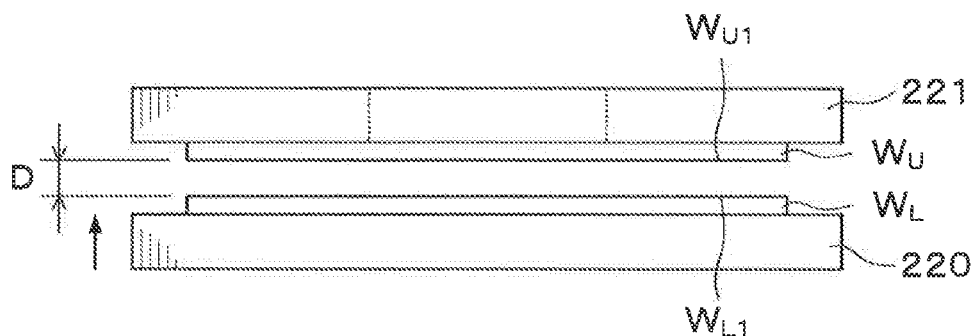
FIG. 19 An explanatory view illustrating the appearance that the positions in the vertical direction of the upper wafer and the lower wafer are adjusted.

Thereafter, the chuck drive part 223 raises the lower chuck 220 to dispose the lower wafer $W_L$ at a predetermined position as illustrated in FIG. 19. In this event, the lower wafer $W_L$ is disposed so that the a distance D between the front surface $W_{L1}$ of the lower wafer $W_L$ and the front surface $W_{U1}$ of the upper wafer $W_U$ is a predetermined distance, for example, 0.5 mm. In this manner, the positions in the vertical direction of the upper wafer $W_U$ and the lower wafer $W_L$ are adjusted (Step S9 in FIG. 17).

Figure 20:
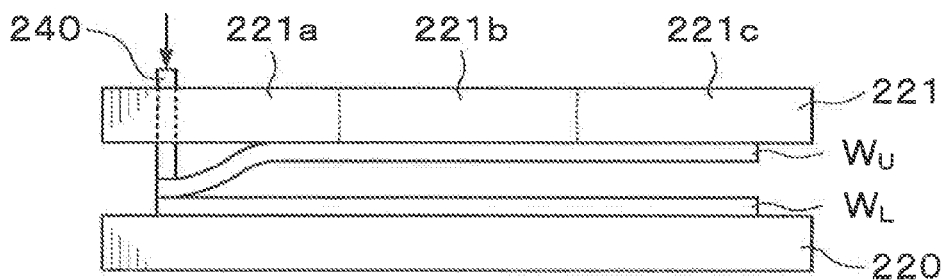
FIG. 20 An explanatory view illustrating the appearance that a pressing and moving member presses one end portion of the upper wafer and one end portion of the lower wafer.

Thereafter, the pressing and moving member 240 is lowered to bring one end portion of the lower wafer $W_L$ and one end portion of the upper wafer $W_U$ into abutment with each other and press them as illustrated in FIG. 20 (Step S10 in FIG. 17). In this event, the upper wafer $W_U$ is vacuumed in all of the regions 221a, 221b, 221c of the upper chuck 221.

Figure 21:
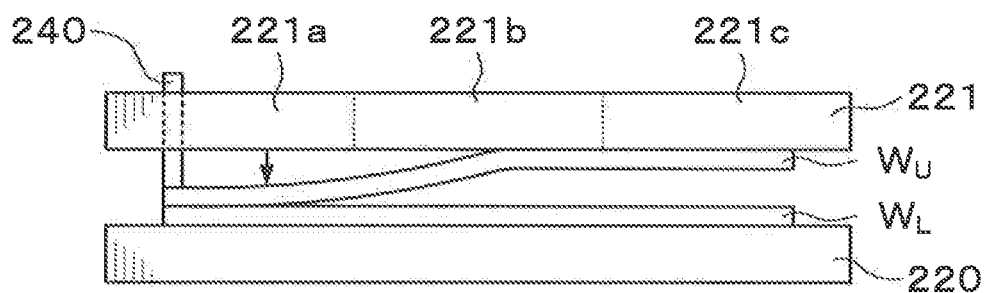
FIG. 21 An explanatory view illustrating the appearance that vacuuming of the upper chuck is stopped for each region.
Figure 22:
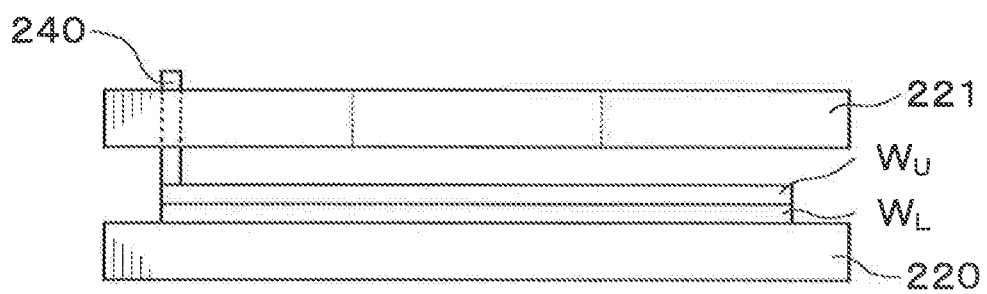
FIG. 22 An explanatory view illustrating the appearance that the upper wafer and the lower wafer are joined together.

Thereafter, in the state that the one end portion of the lower wafer $W_L$ and the one end portion of the upper wafer $W_U$ are pressed by the pressing and moving member 240 as illustrated in FIG. 21, the vacuuming of the upper wafer $W_U$ in the region 221a of the upper chuck 221 is stopped. Thereby, the upper wafer $W_U$ held in the region 221a falls onto the lower wafer $W_L$. Then, the vacuuming of the upper wafer $W_U$ is stopped in the order of the regions 221a, 221b, 221c from the one end side to the other end side of the upper wafer $W_U$. In this manner, the entire front surface $W_{U1}$ of the upper wafer $W_U$ is brought into abutment with the front surface $W_L$ of the lower wafer $W_L$ as illustrated in FIG. 22. Since the front surface $W_{U1}$ of the upper wafer $W_U$ and the front surface $W_{L1}$ of the lower wafer $W_L$ in abutment have been activated at Steps S1 and S5 respectively, the Van der Waals force is first generated between the front surfaces $W_{U1}$ and $W_{L1}$ so that the front surfaces $W_{U1}$ and $W_{L1}$ are joined together. Since the front surface $W_{U1}$ of the upper wafer $W_U$ and the front surface $W_{L1}$ of the lower wafer $W_L$ have been thereafter hydrophilized at Steps S2 and S6 respectively, hydrophilic groups between the front surfaces $W_{U1}$ and $W_{L1}$ are hydrogen-bonded, so that the front surfaces $W_{U1}$ and $W_{L1}$ are strongly joined together. In this manner, the upper wafer $W_U$ and the lower wafer $W_L$ are joined together (Step S11 in FIG. 17).

Note that though the vacuuming of the upper wafer $W_U$ is stopped in the order of the regions 221a, 221b, 221c in this embodiment, the method of stopping the vacuuming is not limited to this. For example, the vacuuming in the regions 221a, 221b may be stopped at the same time, and then the vacuuming in the region 221c may be stopped. Further, the time interval of stopping the vacuuming between the regions 221a and 221b and 221c may be changed. For example, after a lapse of one second after the stop of the vacuuming in the region 221a, the vacuuming in the regions 221b may be stopped, and after a lapse of two seconds after the stop of the vacuuming in the region 221b, the vacuuming in the region 221c may be stopped.

The superposed wafer $W_T$ in which the upper wafer $W_U$ and the lower wafer $W_L$ are joined together is transferred by the wafer transfer apparatus 61 to the transition apparatus 51 and transferred by the wafer transfer apparatus 22 in the transfer-in/out station 2 to the cassette $C_T$ on a predetermined mounting plate 11. Thus, a series of joint processing of the wafers $W_U$, $W_L$ ends.

According to the above embodiment, it is possible to activate the front surfaces $W_{U1}$, $W_{L1}$ of the wafers $W_U$, $W_L$ in the surface activation apparatus 30, and then hydrophilize the front surfaces $W_{U1}$, $W_{L1}$ of the wafers $W_U$, $W_L$ in the surface hydrophilizing apparatus 40 to form hydroxyls on the front surfaces $W_{U1}$, $W_{L1}$. Then, after the activated front surfaces $W_{U1}$ and $W_{L1}$ of the wafers $W_U$ and $W_L$ are joined together by the Van der Waals force in the joint apparatus 41, the hydroxyls on the hydrophilized front surfaces $W_{U1}$, $W_{L1}$ of the wafers $W_U$, $W_L$ are hydrogen-bonded, whereby the wafers $W_U$ and $W_L$ can be strongly joined together. This eliminates the necessity to press the wafers in the superposed state as in the prior art. Accordingly, there is no possibility of breakage of the wafers $W_U$, $W_L$ or no possibility of positional displacement of the wafers $W_U$, $W_L$ as in the prior art. Furthermore, since the wafers $W_U$ and $W_L$ are joined together only by the Van der Waals force and hydrogen bonding, the time required for joint can be reduced. Consequently, according to this embodiment, it is possible to improve the throughput of the wafer joint processing while appropriately joining the wafers $W_U$ and $W_L$ together. Further, the transfer-in/out station 2 is capable of holding a plurality of wafers $W_U$, $W_L$ or a plurality of superposed wafers $W_T$, thereby making it possible to successively transfer the wafers $W_U$, $W_L$ from the transfer-in/out station 2 to the processing station 3 and successively process the wafers $W_U$, $W_L$ in the processing station 3 so as to further improve the throughput of the wafer joint processing.

Further, since the pure water is supplied to the front surfaces $W_{U1}$, $W_{L1}$ of the wafers $W_U$, $W_L$ in the surface hydrophilizing apparatus 40 to hydrophilize and clean the front surfaces $W_{U1}$, $W_{L1}$, the oxide film and particles on the front surfaces $W_{U1}$, $W_{L1}$ are appropriately removed. Accordingly, the wafers $W_U$, $W_L$ can then be appropriately joined together in the joint apparatus 41.

Further, since the pressure inside the joint apparatus 41 is the highest in the joint system 1, an air current directed from the joint apparatus 41 to the wafer transfer region 60 is generated. In other words, atmosphere never flows into the joint apparatus 41 from the outside. Therefore, particles and the like never flow into the joint apparatus 41 from the outside, and the wafers $W_U$ and $W_L$ can be appropriately joined together.

Further, since the pressure inside the wafer transfer region 60 is positive with respect to the pressure inside the surface activation apparatus 30, the pressure inside the surface hydrophilizing apparatus 40, the pressure inside the third processing block G3, and the pressure inside the transfer-in/out station 2, air currents directed from the wafer transfer region 60 to the surface activation apparatus 30, the surface hydrophilizing apparatus 40, the third processing block G3, and the transfer-in/out station 2 are generated. Accordingly, it is possible to prevent particles from adhering to the wafer $W_U$, $W_L$ or the superposed wafers $W_T$ during transfer.

Furthermore, in the surface activation apparatus 30, the pressure inside the processing part 70 and the pressure inside the transfer-in/out part 71 are positive with respect to the pressure inside the transfer part 72, and when the gate valve 73 is opened, an air current directed from the processing part 70 to the transfer part 72 is generated due to the suction through the suction port (not illustrated). In other words, atmosphere never flows into the processing part 70 from the outside. Therefore, particles and the like never flow into the processing part 70 from the outside, and the front surfaces $W_{U1}$, $W_{L1}$ of the wafers $W_U$, $W_L$ can be appropriately activated.

Furthermore, since the atmospheres inside the surface activation apparatus 30, the surface hydrophilizing apparatus 40, and the transfer-in/out station 2 are exhausted to the outside, all of the atmospheres inside the joint system 1 are exhausted to the outside. Accordingly, it is possible to prevent particles from existing in the atmospheres inside the joint system 1.

Figure 23:
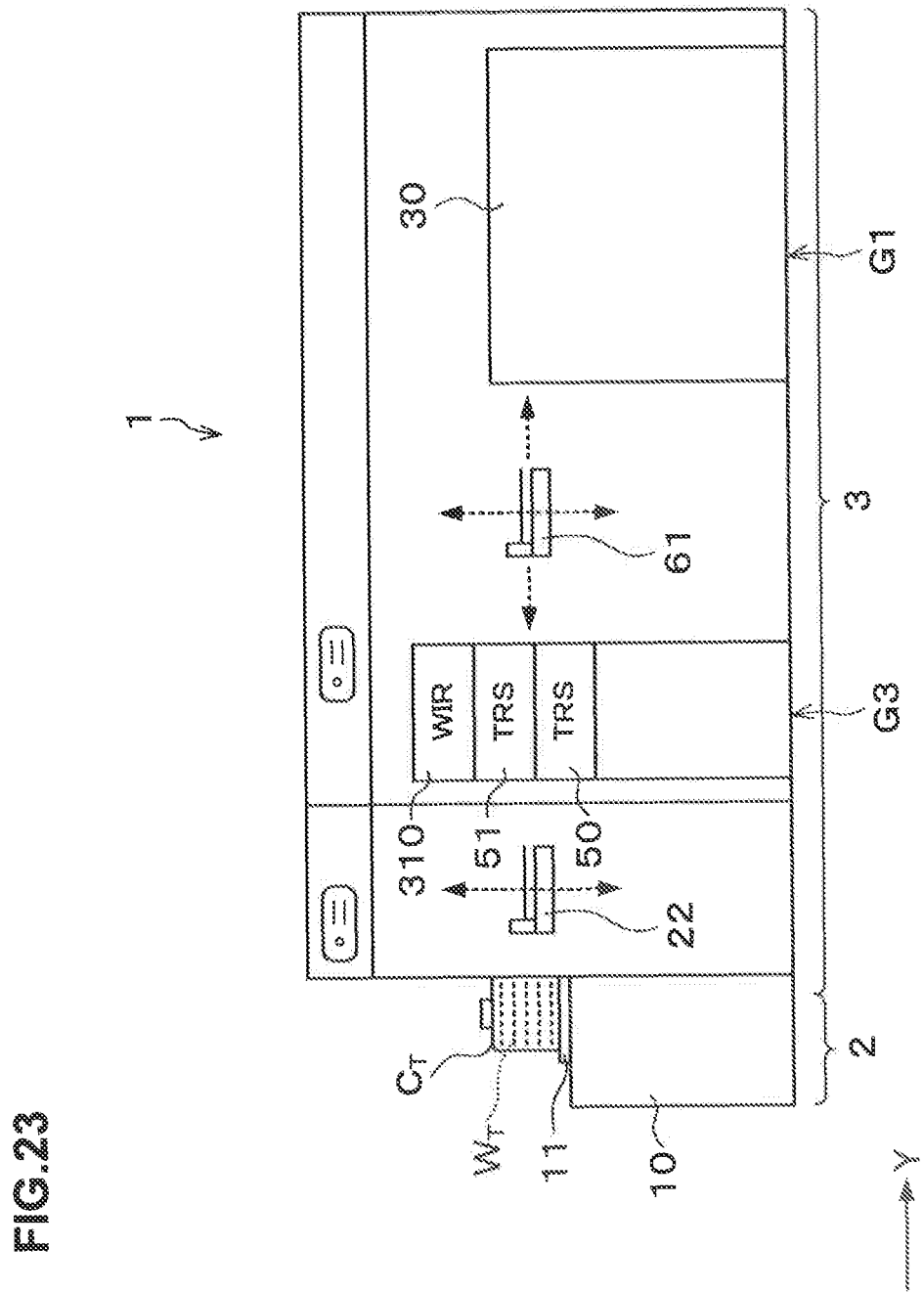
FIG. 23 A side view illustrating the outline of the internal configuration of a joint system according to another embodiment.

In the joint system 1 in the above embodiment, an inspection apparatus 310 inspecting the superposed wafer $W_T$ joined in the joint apparatus 41 may further be provided as illustrated in FIG. 23. The inspection apparatus 310 is disposed, for example, at an uppermost layer in the third processing block G3.

Figure 24:
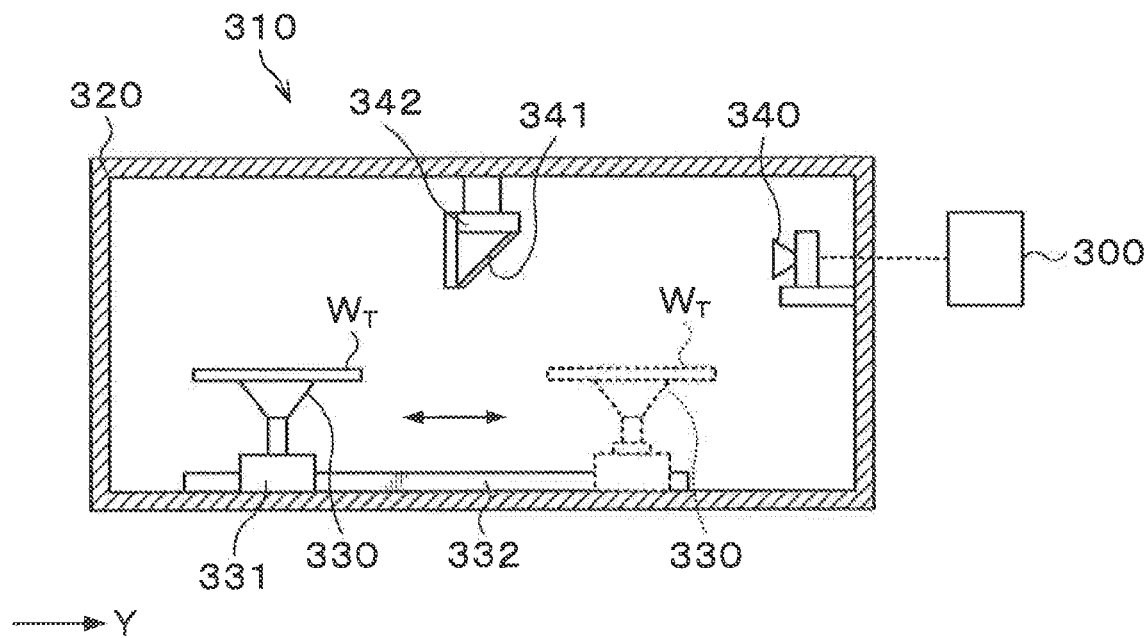
FIG. 24 A longitudinal sectional view illustrating the outline of the configuration of an inspection apparatus.
Figure 25:
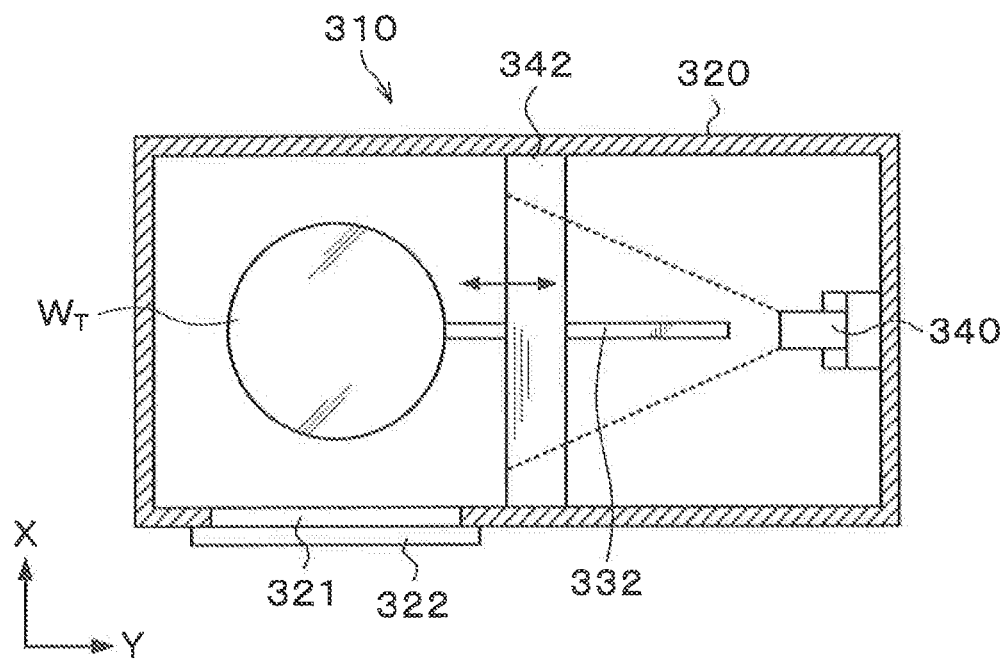
FIG. 25 A transverse sectional view illustrating the outline of the configuration of the inspection apparatus.

The inspection apparatus 310 has a processing container 320 as illustrated in FIG. 24. A transfer-in/out port 321 for transferring the superposed wafer $W_T$ is formed in a side surface on the wafer transfer region 60 side of the processing container 320, and an opening/closing shutter 322 is provided at the transfer-in/out port 321 as illustrated in FIG. 25. Note that the pressure inside the processing container 320 is negative with respect to the wafer transfer region 60 so that when the opening/closing shutter 322 is opened, an air current directed from the wafer transfer region 60 to the inspection apparatus 310 is generated.

Inside the processing container 320, a chuck 330 is provided which suction-holds the superposed wafer $W_T$ thereon as illustrated in FIG. 24. The chuck 330 freely rotates and stops by means of a chuck drive part 331 equipped with, for example, a motor or the like, and has an alignment function for adjusting the position of the superposed wafer $W_T$. At the bottom surface of the processing container 320, a rail 332 is provided which extends from one end side (a Y-direction negative direction side in FIG. 24) to the other end side (a Y-direction positive direction side in FIG. 24) in the processing container 320. The chuck drive part 331 is attached on the rail 332. By means of the chuck drive part 331, the chuck 330 can move along the rail 332 and freely rises and lowers.

On a side surface on the other end side (the Y-direction positive direction side in FIG. 24) in the processing container 320, an image-pickup part 340 is provided. As the image-pickup part 340, for example, a wide-angle CCD camera is used. Near the middle of the upper portion of the processing container 320, a half mirror 341 is provided. The half mirror 341 is provided at a position facing the image-pickup part 340, and provided inclined at 45 degrees from the vertical direction. An infrared-ray irradiation part 342 irradiating the superposed wafer $W_T$ with infrared rays is provided, and the half mirror 341 and the infrared-ray irradiation part 342 are fixed on the upper surface of the processing container 320. Further, the infrared-ray irradiation part 342 extends in the X-direction as illustrated in FIG. 25.

In this case, the superposed wafer $W_T$ joined at Step S11 in the above-described joint apparatus 41 is transferred by the wafer transfer apparatus 61 to the inspection apparatus 310. The superposed wafer $W_T$ transferred into the inspection apparatus 310 is delivered from the wafer transfer apparatus 61 to the chuck 330. Thereafter, the chuck 330 is moved by the chuck drive part 331 along the rail 332, and the moving superposed wafer $W_T$ is irradiated with the infrared rays from the infrared-ray irradiation part 342. Then, an image of the entire surface of the superposed wafer $W_T$ is picked up by the image-pickup part 340 through the half mirror 341. The picked-up image of the superposed wafer $W_T$ is outputted to the control unit 300, and whether or not the joint of the superposed wafer $W_T$ is appropriately performed, for example, the presence or absence of void in the superposed wafer $W_T$ is inspected in the control unit 300. Thereafter, the superposed wafer $W_T$ is transferred by the wafer transfer apparatus 61 to the transition apparatus 51 and then transferred by the wafer transfer apparatus 22 in the transfer-in/out station 2 to the cassette $C_T$ on the predetermined cassette mounting plate 11.

According to the above embodiment, since the superposed wafer $W_T$ can be inspected in the inspection apparatus 310, the processing condition in the joint system 1 can be corrected based on the inspection result. Accordingly, the wafers $W_U$ and $W_L$ can be further appropriately joined together.

Figure 26:
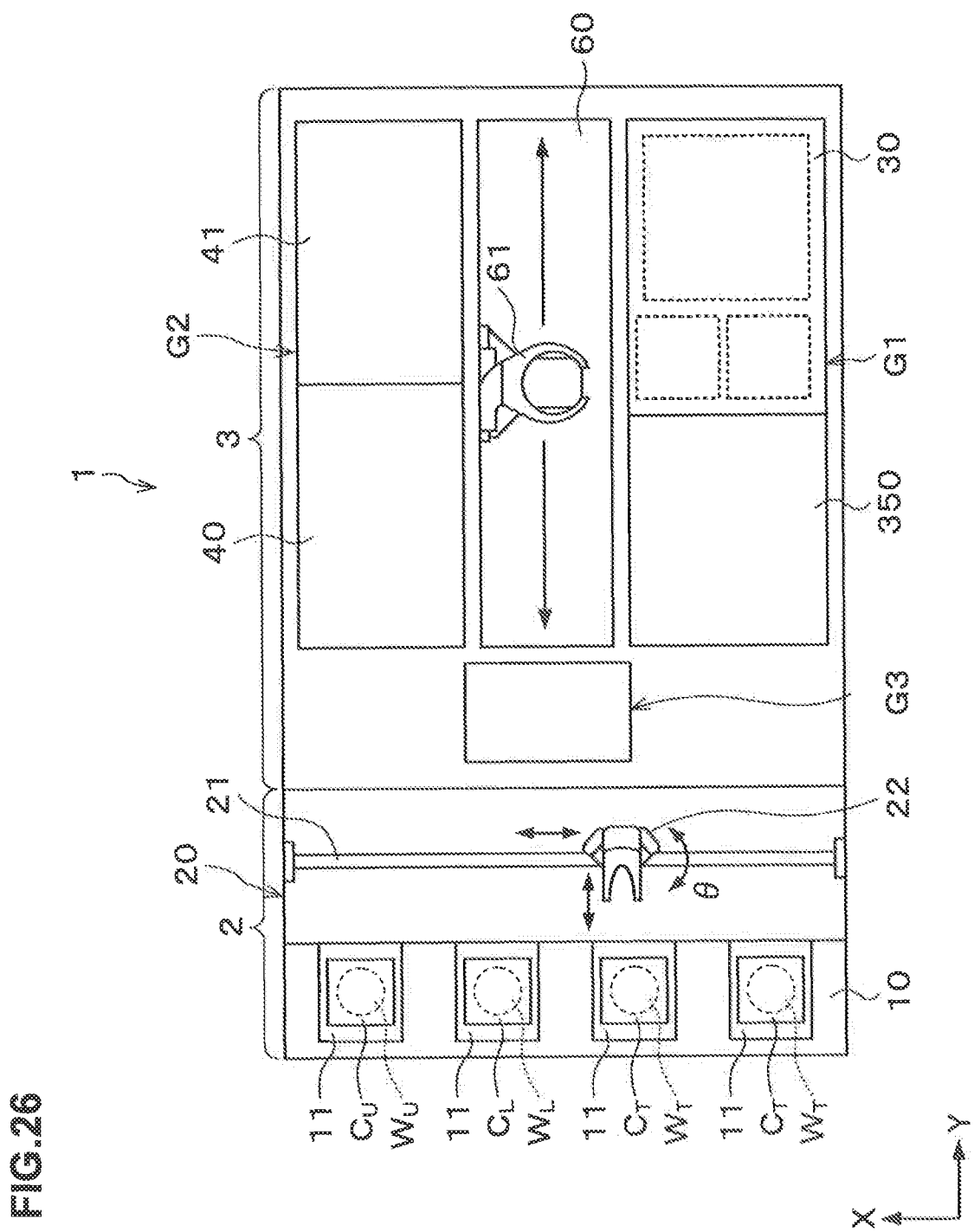
FIG. 26 A plan view illustrating the outline of the configuration of a joint system according to another embodiment.

In the joint system 1 in the above embodiment, a thermal processing apparatus 350 performing heat processing on the superposed wafer $W_T$ joined in the joint apparatus 41 may further be provided as illustrated in FIG. 26. The thermal processing apparatus 350 is disposed, for example, on the transfer-in/out station 2 side of the surface activation apparatus 30 in the first processing block G1.

Figure 27:
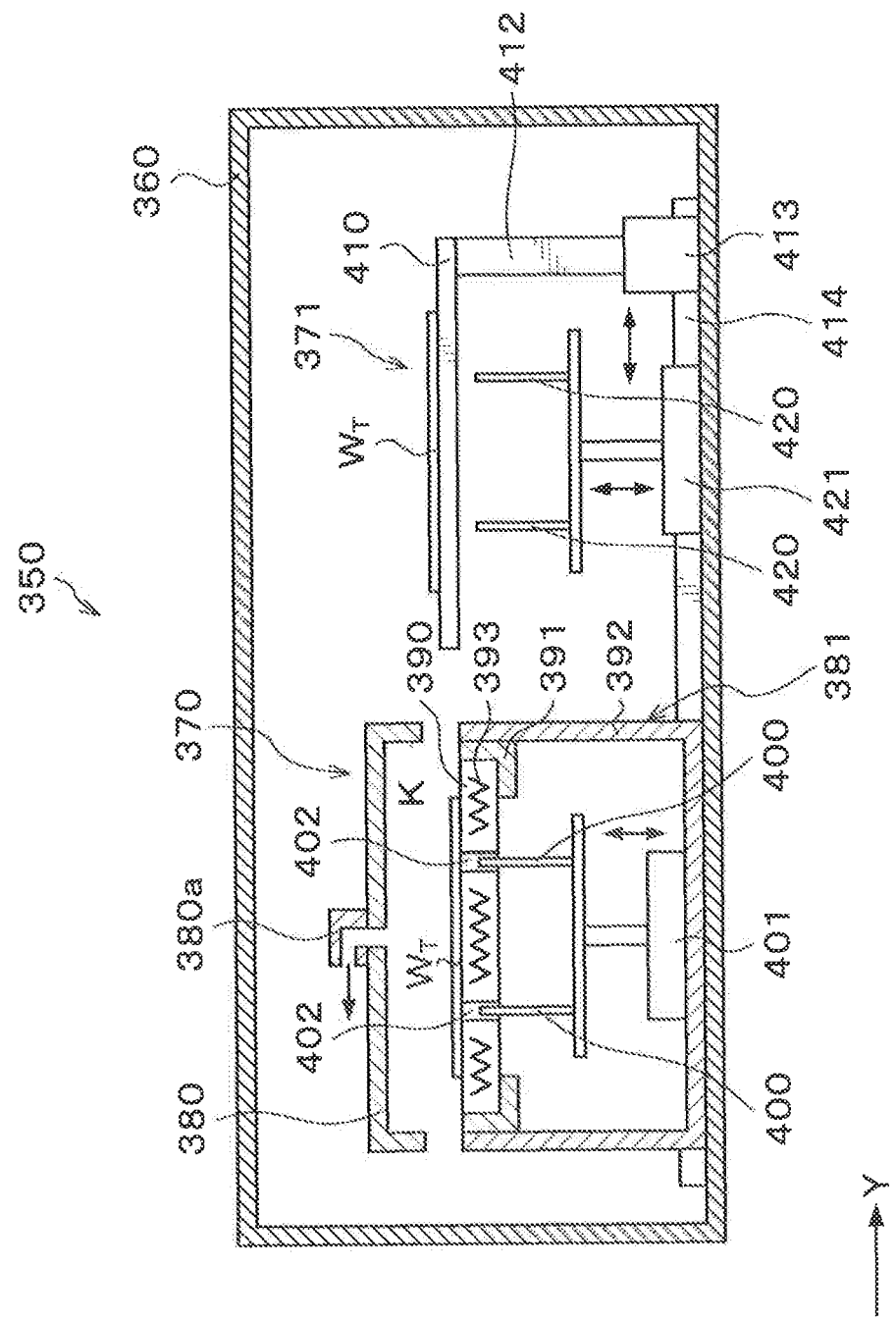
FIG. 27 A longitudinal sectional view illustrating the outline of the configuration of a thermal processing apparatus.

The thermal processing apparatus 350 has a processing container 360 which can close the inside thereof as illustrated in FIG. 27. In a side surface on the wafer transfer region 60 side of the processing container 360, a transfer-in/out port 361 for the superposed wafer $W_T$ is formed as illustrated in FIG. 28, and an opening/closing shutter 362 is provided at the transfer-in/out port 361. Note that the pressure inside the processing container 360 is negative with respect to the wafer transfer region 60 so that when the opening/closing shutter 362 is opened, an air current directed from the wafer transfer region 60 to the thermal processing apparatus 350 is generated.

Inside the processing container 360, a heating part 370 performing heat processing on the superposed wafer $W_T$ and a cooling part 371 performing cooling processing on the superposed wafer $W_T$ are provided. The heating part 370 and the cooling part 371 are provided side by side in the Y-direction, and the cooling part 371 is disposed on the transfer-in/out port 361 side.

The heating part 370 includes a lid body 380 located on the upper side as illustrated in FIG. 27 and vertically movable and a thermal plate housing part 381 located on the lower side and united with the lid body 380 to form a processing chamber K.

The lid body 380 has an almost cylindrical shape with its lower surface open. At the middle portion of the upper surface of the lid body 380, an exhaust part 380a is provided. The atmosphere inside the processing chamber K is uniformly exhausted through the exhaust part 380a.

The thermal plate housing part 381 includes an annular holding member 391 housing a thermal plate 390 and holding the outer peripheral portion of the thermal plate 390, and a support ring 392 in an almost cylindrical shape surrounding the outer periphery of the holding member 391. The thermal plate 390 has an almost thick disk shape and can mount and heat the superposed wafer $W_T$ thereon. Further, in the thermal plate 390, a heater 393 generating heat, for example, by power feeding is embedded. The heating temperature of the thermal plate 390 is controlled, for example, by the control unit 300 so that the superposed wafer $W_T$ mounted on the thermal plate 390 is heated to a predetermined temperature.

Below the thermal plate 390, for example, three raising and lowering pins 400 are provided for supporting the superposed wafer $W_T$ from below and raising and lowering the superposed wafer $W_T$. The raising and lowering pins 400 can move up and down by means of a raising and lowering drive part 401. Near the middle portion of the thermal plate 390, through holes 402 penetrating the thermal plate 390 in the thickness direction are formed, for example, at three positions. The raising and lowering pins 400 are inserted into the through holes 402 to be able to project from the upper surface of the thermal plate 390.

A cooling plate 410 has an almost square flat plate shape as illustrated in FIG. 28 and has an end face on the thermal plate 390 side curved in an arc shape. In the cooling plate 410, two slits 411 are formed along the Y-direction. The slits 411 are formed from the end face on the thermal plate 390 side of the cooling plate 410 to the vicinity of the middle portion of the cooling plate 410. The slits 411 can prevent the cooling plate 410 from interfering with the raising and lowering pins 400 of the heating part 370 and later-described raising and lowering pins 420 of the cooling part 371. Further, in the cooling plate 410, a cooling member (not illustrated) such as a cooling water or a Peltier element is embedded. The cooling temperature of the cooling plate 410 is controlled, for example, by the control unit 300 so that the superposed wafer $W_T$ mounted on the cooling plate 410 is cooled to a predetermined temperature.

The cooling plate 410 is supported on a supporting arm 412 as illustrated in FIG. 27. On the supporting arm 412, a drive part 413 is attached. The drive part 413 is attached on a rail 414 extending in the Y-direction. The rail 414 extends from the cooling part 371 to the heating part 370. By means of the drive part 413, the cooling plate 410 can move along the rail 414 between the heating part 370 and the cooling part 371.

Below the cooling plate 410, for example, three raising and lowering pins 420 for supporting the superposed wafer W from below and raising and lowering it are provided. The raising and lowering pins 420 can move up and down by means of a raising and lowering drive part 421. Then, the raising and lowering pins 420 pass through the slits 411 to be able to project from the upper surface of the cooling plate 410.

In this case, the superposed wafer $W_T$ joined at Step S11 in the above-described joint apparatus 41 is transferred by the wafer transfer apparatus 61 to the thermal processing apparatus 350. After the superposed wafer $W_T$ is transferred into the thermal processing apparatus 350, the superposed wafer $W_T$ is delivered from the wafer transfer apparatus 61 to the raising and lowering pins 420 which have been raised and waiting in advance. Subsequently, the raising and lowering pins 420 are lowered to mount the superposed wafer $W_T$ on the cooling plate 410.

Thereafter, the cooling plate 410 is moved along the rail 414 by the drive part 413 to above the thermal plate 390, and the superposed wafer $W_T$ is delivered to the raising and lowering pins 400 which have been raised and waiting and waiting in advance. Then, after the lid body 380 is closed, the raising and lowering pins 400 are lowered to mount the superposed wafer $W_T$ on the thermal plate 390. Then, the superposed wafer $W_T$ on the thermal plate 390 is heated to a predetermined temperature, for example, 100° C. to 200° C. The heating performed by the thermal plate 390 heats the superposed wafer $W_T$ to dehydrate and condense the hydrogen bonding between the front surfaces $W_{U1}$ and $W_{L1}$ of the wafers $W_U$ and $W_L$, so that the wafers $W_U$ and $W_L$ are strongly joined together.

Then, after the lid body 380 is opened, the raising and lowering pins 400 are raised and the cooling plate 410 is moved to above the thermal plate 390. Subsequently, the superposed wafer $W_T$ is delivered from the raising and lowering pins 400 to the cooling plate 410, and the cooling plate 410 is moved to the transfer-in/out port 361 side. During the movement of the cooling plate 410, the superposed wafer $W_T$ is cooled to a predetermined temperature, for example, room temperature (23° C.).

Then, the superposed wafer $W_T$ is transferred by the wafer transfer apparatus 61 to the transition apparatus 51 and then transferred by the wafer transfer apparatus 22 in the transfer-in/out station 2 to the cassette $C_T$ on the predetermined cassette mounting plate 11. Note that if the above-described inspection apparatus 310 is provided in the third processing block G3 in this embodiment, the inspection of the superposed wafer $W_T$ is performed in the inspection apparatus 310 before the superposed wafer $W_T$ is transferred to the transfer-in/out station 2.

According to the above embodiment, it is possible to perform heat processing on the superposed wafer $W_T$ in the thermal processing apparatus 350 so as to dehydrate and condense the hydrogen bonding between the front surfaces $W_{U1}$ and $W_{L1}$ of the wafers $W_U$ and $W_L$ to make the joint of the wafers $W_U$ and $W_L$ stronger. Here, the superposed wafer $W_T$ transferred out of the joint system 1 is baked in a furnace placed outside the joint system 1, but it takes a lot of time to bake the superposed wafer $W_T$. According to this embodiment, the baking time can be reduced.

Note that one end portion of the upper wafer $W_U$ held on the upper chuck 221 is pressed by the pressing and moving member 240 in the joint apparatus 41 in this embodiment. However, a cutout through which the pressing and moving member 240 passes may be provided at the middle portion of the upper chuck 221 so that the pressing and moving member 240 may press not the one end portion of the upper wafer $W_U$ but the middle portion of the upper wafer $W_U$. Note that in this case, the pressing and moving member 240 is located at a position where the pressing and moving member 240 can pass through the cutout provided at the middle portion of the upper chuck 221. Next, the operation in this case will be described. The vacuuming in the region 221b of the upper chuck 221 corresponding to the middle portion of the upper wafer $W_U$ is stopped first. Then, the pressing and moving member 240 presses the middle portion of the upper wafer $W_U$. After the middle portions of the upper wafer $W_U$ and the lower wafer $W_L$ are brought into abutment with each other, the vacuuming in the regions 221a, 221c of the upper chuck 221 is stopped. Such an operation makes it possible to bring the upper wafer $W_U$ and the lower wafer $W_L$ into abutment with each other without positional displacement.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention. The present invention is not limited to the embodiments but can take various forms. The present invention is also applicable to the case where the substrate is a substrate other than the wafer, such as an FPD (Flat Panel Display), a mask reticle for a photomask or the like.

INDUSTRIAL APPLICABILITY

The present invention is useful in joining substrates such as semiconductor wafers and the like together.

EXPLANATION OF CODES 1 joint system
2 transfer-in/out station
3 processing station
30 surface activation apparatus
40 surface hydrophilizing apparatus
41 joint apparatus
60 wafer transfer region
70 processing part
71 transfer-in/out part
72 transfer part
300 control unit
310 inspection apparatus
350 thermal processing apparatus
$W_U$ upper wafer
$W_{U1}$ front surface
$W_L$ lower wafer
$W_{U1}$ front surface
$W_T$ superposed wafer

What is claimed:

1. A joint system joining substrates together, comprising:
a processing station performing predetermined processing on substrates and joining the substrates together; and
a transfer-in/out station capable of holding a plurality of substrates or a plurality of superposed substrates in which the substrates are joined together, and transferring-in/out the substrates or superposed substrates to/from said processing station,
wherein said processing station comprises:
    a surface activation apparatus activating a front surface to be joined of the substrate;
    a surface hydrophilizing apparatus hydrophilizing the front surface of the substrate activated in said surface activation apparatus;
    a joint apparatus joining the substrates having the surfaces hydrophilized in said surface hydrophilizing apparatus together; and
    a transfer region for transferring the substrate or superposed substrate to said surface activation apparatus, said surface hydrophilizing apparatus, and said joint apparatus, wherein
a pressure inside said transfer region is equal to or more than an atmospheric pressure,
a pressure inside said joint apparatus is positive with respect to a pressure inside said transfer region, and
the pressure inside said transfer region is positive with respect to a pressure inside said surface activation apparatus, a pressure inside said surface hydrophilizing apparatus, and a pressure inside said transfer-in/out station.

2. The joint system as set forth in claim 1,
wherein said surface hydrophilizing apparatus supplies pure water to the front surface of the substrate to hydrophilize and clean the front surface.

3. The joint system as set forth in claim 1,
wherein said surface activation apparatus comprises a processing part performing processing for activating the front surface of the substrate, a transfer-in/out part for transferring-in/out the substrate to/from said transfer region, and a transfer part transferring the substrate between said processing part and said transfer-in/out part, and
wherein a pressure inside said processing part and a pressure inside said transfer-in/out part are positive with respect to a pressure inside said transfer part.

4. The joint system as set forth in claim 1, further comprising:
an inspection apparatus inspecting the superposed substrate joined in said joint apparatus.

5. The joint system as set forth in claim 1, further comprising:

a thermal processing apparatus performing thermal processing on the superposed substrate joined in said joint apparatus.

6. A method of joining substrates together, comprising:

a surface activation step of activating a front surface to be joined of a substrate in a surface activation apparatus;

a surface hydrophilizing step of then transferring the substrate to a surface hydrophilizing apparatus via a transfer region, and hydrophilizing the front surface of the substrate in the surface hydrophilizing apparatus; and a joint step of then transferring the substrate to a joint apparatus via the transfer region, and joining the substrates subjected to said surface activation step and said surface hydrophilizing step together by a Van der Waals force and hydrogen bonding in the joint apparatus, wherein said surface activation step, said surface hydrophilizing step, and said joint step are successively performed on a plurality of substrates, a pressure inside the transfer region is equal to or more than an atmospheric pressure a pressure inside the joint apparatus is positive with respect to a pressure inside the transfer region, and the pressure inside the transfer region is positive with respect to a pressure inside the surface activation apparatus and a pressure inside the surface hydrophilizing apparatus.

7. The joint method as set forth in claim 6, wherein pure water is supplied to the front surface of the substrate to hydrophilize and clean the front surface in said surface hydrophilizing step.

8. The joint method as set forth in claim 6, wherein the surface activation apparatus comprises a processing part performing processing for activating the front surface of the substrate, a transfer-in/out part for transferring-in/out the substrate to/from the transfer region, and a transfer part transferring the substrate between the processing part and the transfer-in/out part, and wherein a pressure inside the processing part and a pressure inside the transfer-in/out part are positive with respect to a pressure inside the transfer part.

9. The joint method as set forth in claim 6, further comprising:

an inspection step of inspecting the superposed substrate after said joint step.

10. The joint method as set forth in claim 6, further comprising:

a thermal processing step of performing thermal processing on the superposed substrate after said joint step.

11. A non-transitory readable computer storage medium storing a program running on a computer of a control unit controlling a joint system to cause the joint system to execute a joint method of joining substrates together, said joint method comprising:

a surface activation step of activating a front surface to be joined of a substrate in a surface activation apparatus;

a surface hydrophilizing step of then transferring the substrate to a surface hydrophilizing apparatus via a transfer region, and hydrophilizing the front surface of the substrate in the surface hydrophilizing apparatus; and a joint step of then transferring the substrate to a joint apparatus via the transfer region, and joining the substrates subjected to said surface activation step and said surface hydrophilizing step together by a Van der Waals force and hydrogen bonding in the joint apparatus, wherein said surface activation step, said surface hydrophilizing step, and said joint step are successively performed on a plurality of substrates, a pressure inside the transfer region is equal to or more than an atmospheric pressure a pressure inside the joint apparatus is positive with respect to a pressure inside the transfer region, and the pressure inside the transfer region is positive with respect to a pressure inside the surface activation apparatus and a pressure inside the surface hydrophilizing apparatus.

* * * * *